(12) United States Patent
Tsuruta et al.

(10) Patent No.: US 9,990,575 B2
(45) Date of Patent: Jun. 5, 2018

(54) CARD AND CARD PRODUCTION METHOD

(71) Applicant: Dai Nippon Printing Co., Ltd., Tokyo (JP)

(72) Inventors: Kazuya Tsuruta, Ushiku (JP); Tatsunosuke Ogawa, Ushiku (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 313 days.

(21) Appl. No.: 14/386,293

(22) PCT Filed: Mar. 22, 2013

(86) PCT No.: PCT/JP2013/058421
§ 371 (c)(1),
(2) Date: Sep. 18, 2014

(87) PCT Pub. No.: WO2013/141384
PCT Pub. Date: Sep. 26, 2013

(65) Prior Publication Data
US 2015/0109741 A1    Apr. 23, 2015

(30) Foreign Application Priority Data

Mar. 22, 2012  (JP) ................................ 2012-065276

(51) Int. Cl.
*H05K 1/00* (2006.01)
*G06K 19/077* (2006.01)
(Continued)

(52) U.S. Cl.
CPC ....... *G06K 19/07722* (2013.01); *H05K 1/181* (2013.01); *H05K 7/02* (2013.01);
(Continued)

(58) Field of Classification Search
USPC ............ 361/748, 679.01, 720; 428/189, 138
See application file for complete search history.

(56) References Cited

U.S. PATENT DOCUMENTS 6,166,911 A * 12/2000 Usami .............. G06K 19/07728
235/492
7,172,130 B2  2/2007 Tsunoda et al.
(Continued)

FOREIGN PATENT DOCUMENTS

JP     03027982 A   2/1991
JP     2002074293 A 3/2002
(Continued)

OTHER PUBLICATIONS

Extended European Search Report dated Oct. 16, 2015 issued during the prosecution of European Patent Application No. 13763630.4.
(Continued)

*Primary Examiner* — Andargie M Aychillhum
(74) *Attorney, Agent, or Firm* — Locke Lord LLP; James E. Armstrong, IV; Nicholas J. DiCeglie, Jr.

(57) ABSTRACT

To provide a card capable of improving external appearance, and a card production method. A card (1) is provided with: a module substrate (30); a lower layer (10) and an upper layer (50) arranged above and below the module substrate (30), the layers having an outline larger than the outline of the module substrate (30); and thickness adjustment layers (11, 51) for adjusting the thickness in a substrate outward region (S1), the thickness adjustment layers being provided between the lower layer (10) and the upper layer (50) and to the substrate outward region (S1) further outward than the outline of the module substrate (30), and being provided by printing to at least one layer among the layers that form the card (1).

16 Claims, 21 Drawing Sheets

(51) Int. Cl.
　　　*H05K 1/18*　　　(2006.01)
　　　*H05K 7/02*　　　(2006.01)
　　　*H05K 13/04*　　　(2006.01)
(52) U.S. Cl.
　　　CPC ......... *H05K 13/04* (2013.01); *H05K 2201/20* (2013.01); *Y10T 29/4913* (2015.01); *Y10T 156/10* (2015.01); *Y10T 428/24331* (2015.01); *Y10T 428/24752* (2015.01)

(56) References Cited

U.S. PATENT DOCUMENTS

| | | | |
|---|---|---|---|
| 2005/0101060 A1 | 5/2005 | Tsunoda et al. | |
| 2008/0176046 A1* | 7/2008 | Yamaguchi | B81C 3/008 428/195.1 |
| 2009/0242645 A1* | 10/2009 | Komatsu | G06K 19/07749 235/488 |

FOREIGN PATENT DOCUMENTS

| | | | |
|---|---|---|---|
| JP | 2007272806 A | 10/2007 | |
| JP | 2009157742 A | 7/2009 | |
| JP | 2011095963 A | 5/2011 | |
| KR | 2005-0033860 A | 4/2005 | |

OTHER PUBLICATIONS

Office Action dated Aug. 20, 2015 in Korean Application No. 10-2014-7023657.
International Search Report dated Jun. 18, 2013 for PCT/JP2013/058421.

* cited by examiner

FIG. 8
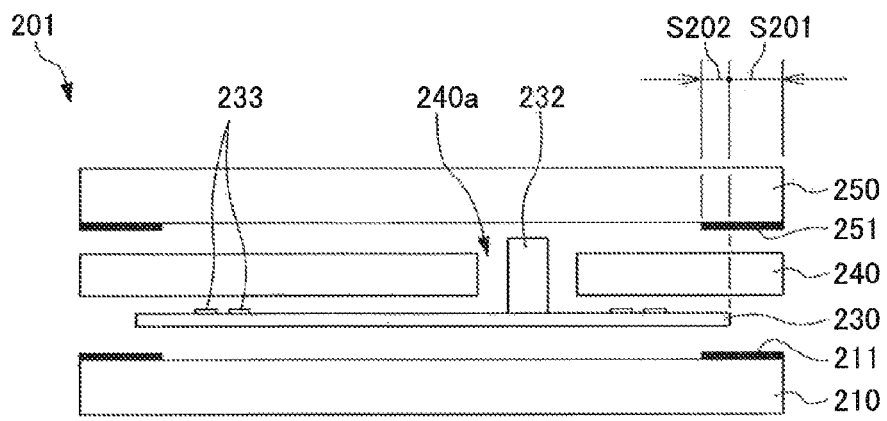
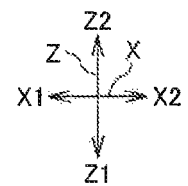

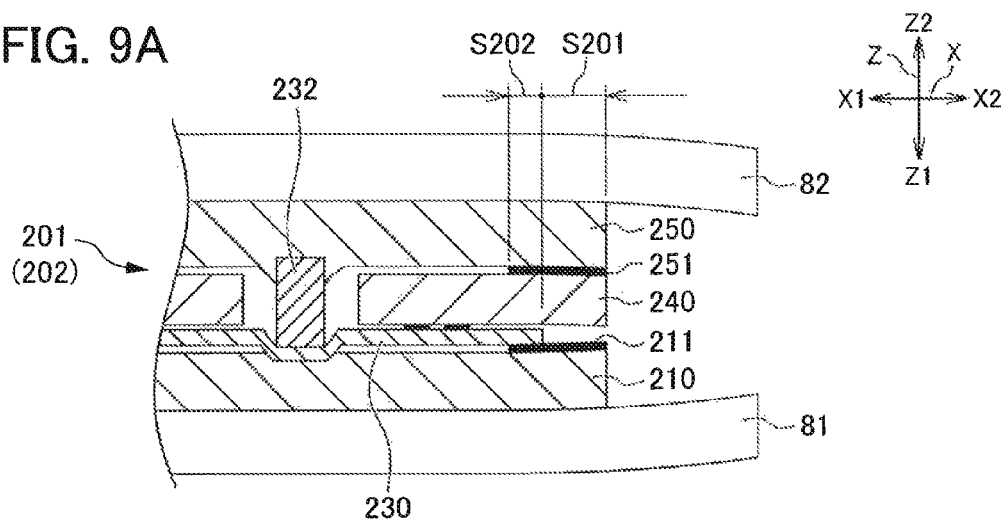
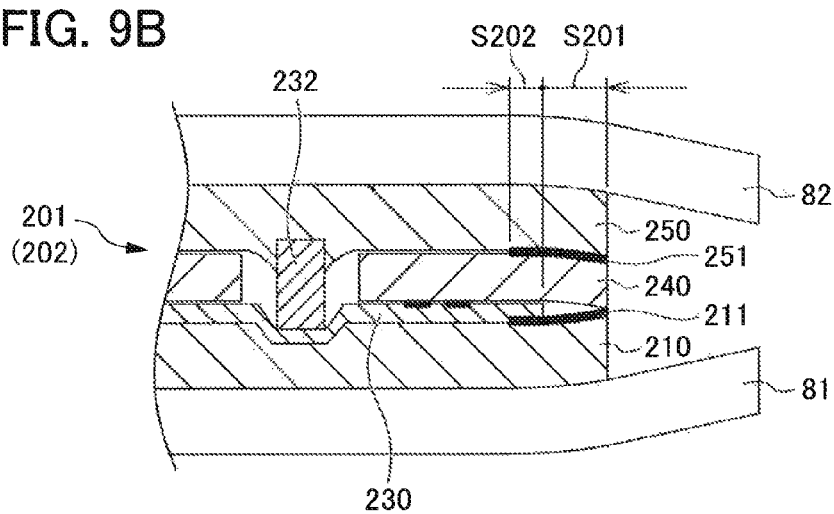
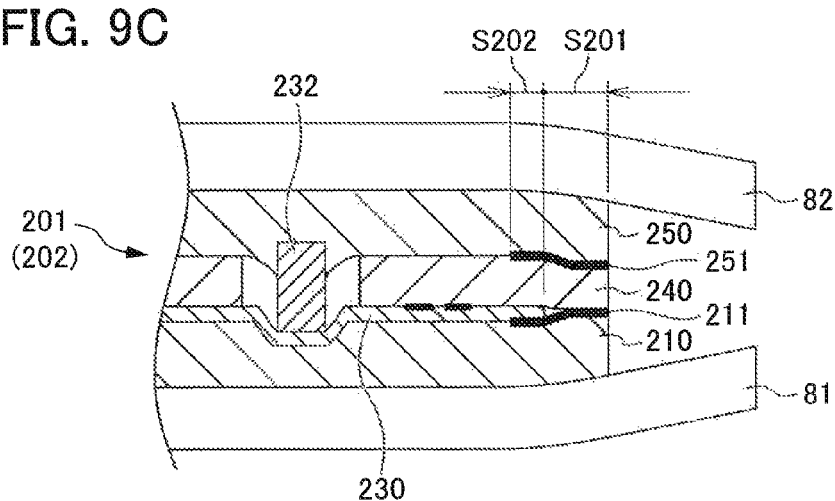

FIG. 11
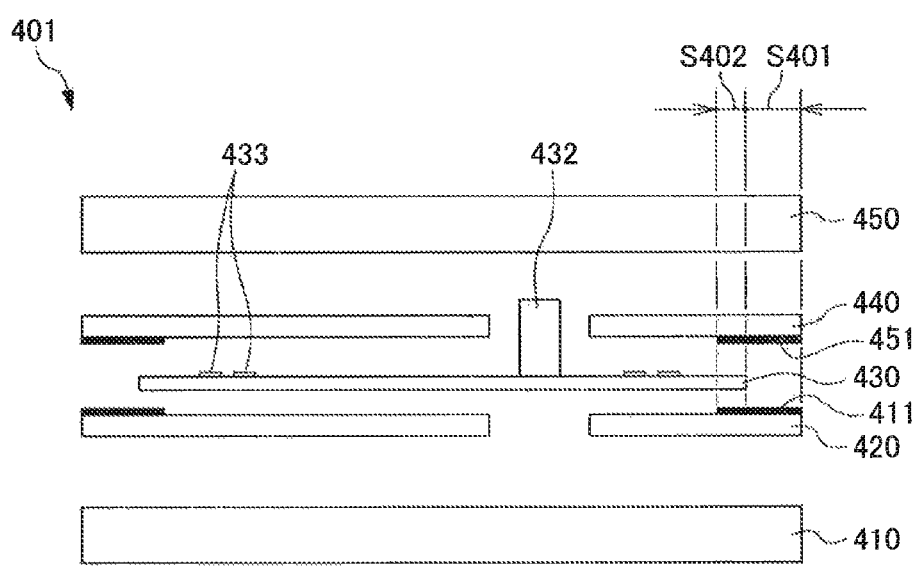
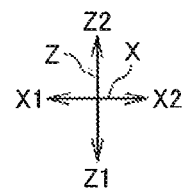

FIG. 13
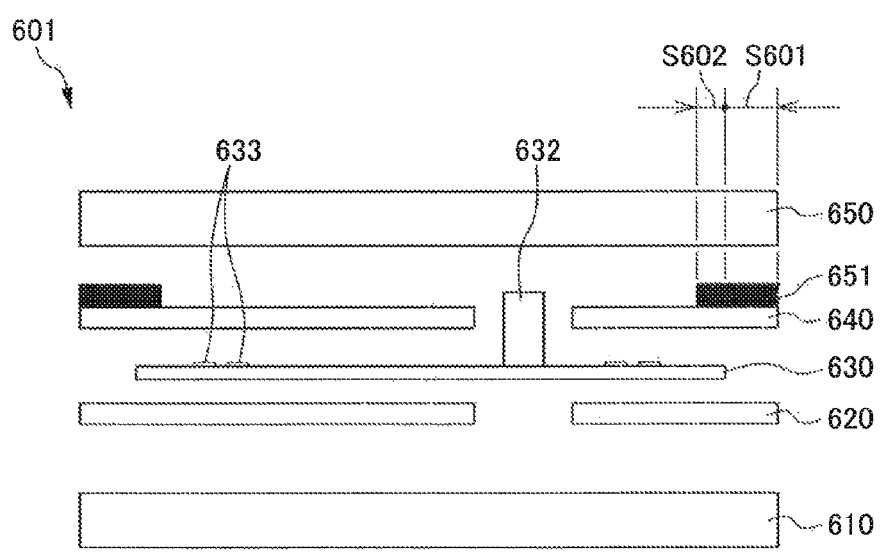
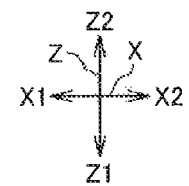

FIG. 14
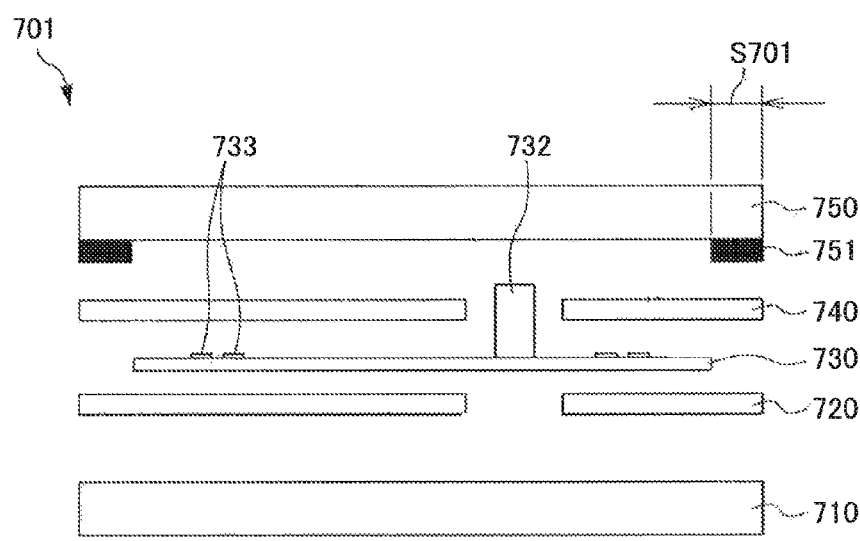
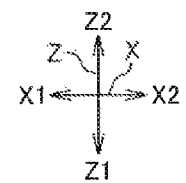

FIG. 15
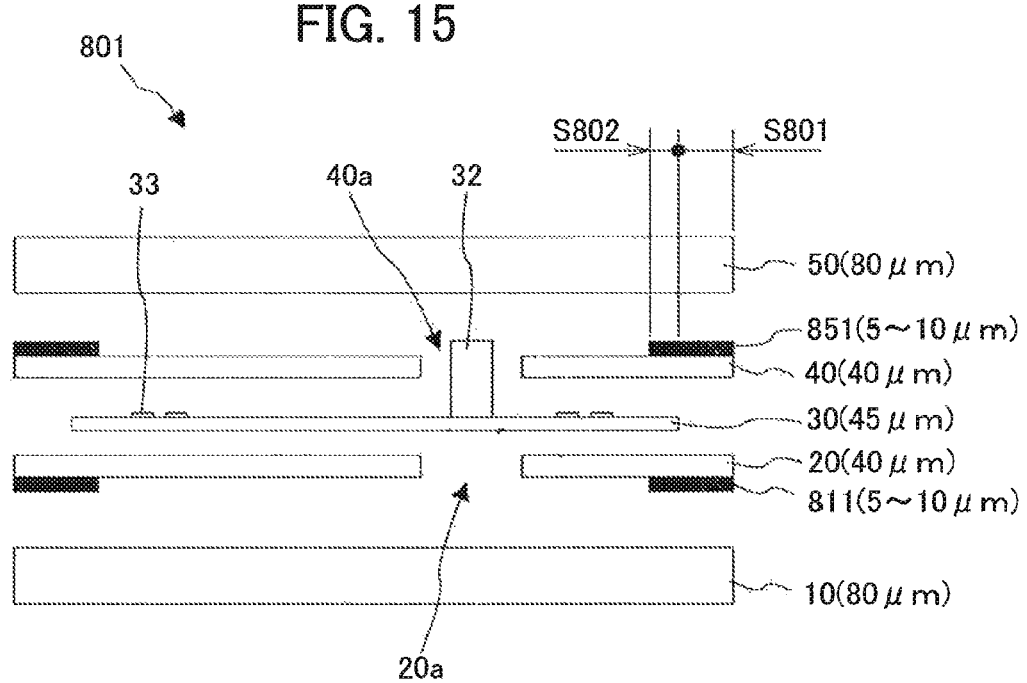
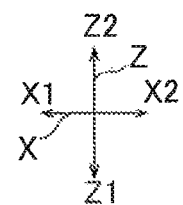

FIG. 18
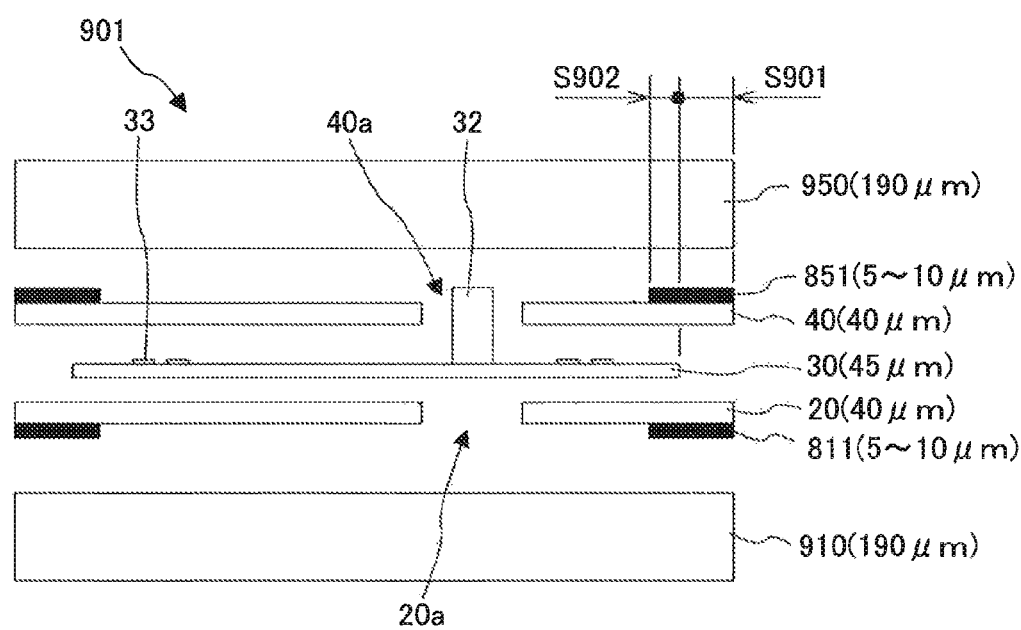
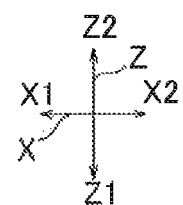

FIG. 19
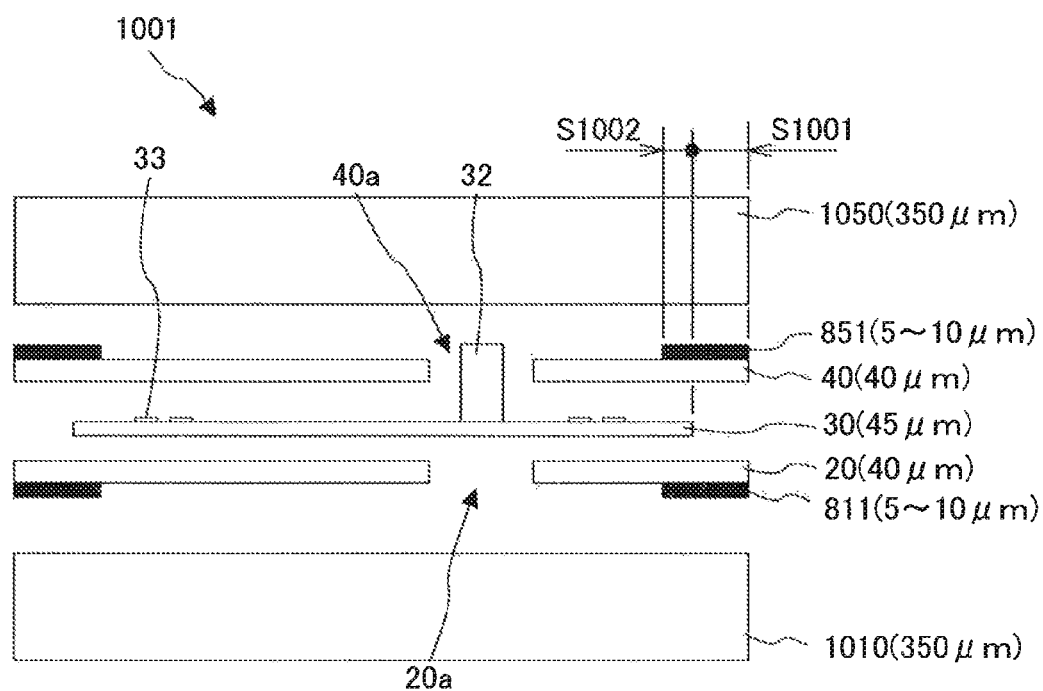
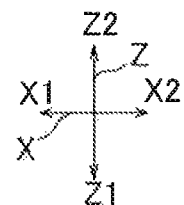

CARD AND CARD PRODUCTION METHOD

CROSS-REFERENCE TO RELATED APPLICATIONS

This application is the national phase under 35 U.S.C. § 371 of PCT International Application No. PCT/JP2013/058421, filed Mar. 22, 2013, which claims the benefit of Japanese Patent Application No. 2012-065276, filed Mar. 22, 2012, the entire contents of the aforementioned applications are hereby incorporated herein by reference.

TECHNICAL FIELD

The present invention relates to a card including a substrate inside and a card production method.

BACKGROUND ART

Conventionally, IC cards exist that enclose inside them an antenna substrate by sandwiching the antenna substrate between upper and lower core sheet, thermally bonding the outer region which is larger than the antenna substrate, of the core sheet by heating and pressing (e.g. see Patent Literature 1).

However, the thickness of the outer region is less than the thickness of the region in which the antenna substrate is laminated, by the thickness of the antenna substrate. Therefore, in the outer region, a gap is formed between the upper and lower core sheets that causes insufficient heating and pressing. As a result, a defect-like recess is formed or the shape of the outer peripheral edge of the antenna may appear on the card surface, which causes a problem in external appearance. To solve the problem, pressing is required for a long period of time, which causes deterioration in production efficiency.

[Patent Document 1] Japanese Unexamined Patent Application, Publication No, 2007-272806

DISCLOSURE OF THE INVENTION

Problems to be Solved by the Invention

The object of the present invention is to provide a card capable of improving external appearance, and a card production method.

Means for Solving the Problems

According to the present invention, the problem is solved by the solving means as described below. For better understanding, the description will be made using reference signs corresponding to the embodiment of the present invention. However, it is not limited to the embodiment. The configuration described with reference signs may be suitably improved. At least a portion of the configuration may be substituted with other components.

A first aspect provides a card formed by bonding layers with each other by pressing, the card including: a substrate (30, 230, 330, 430, 530, 630, 730); an upper layer (50, 250, 350, 450, 550, 650, 750, 850, 950, 1050, 1150) that has an outline larger than the outline of the substrate and is disposed above the substrate; a lower layer (10, 210, 310, 410, 510, 610, 810, 910, 1010, 1110) that has an outline larger than the outline of the substrate and is disposed below the substrate; and a thickness adjustment layer (11, 51, 211, 251, 311, 351, 411, 451, 551, 651, 751, 811, 851) provided in the substrate outer region (S1, S201, S301, S401, S501, S601, S701, S801, S901, S1001, S1101) that is the region between the upper layer and the lower layer and in the outer side of the outline of the substrate, the thickness adjustment layer being provided by printing on at least one layer among the layers that form the card and which is used for adjusting the thickness in the substrate outer region.

A second aspect provides the card according to the first aspect, wherein at least a portion of the thickness adjustment layer (11, 51, 211, 251, 311, 351, 411, 451, 511, 551, 651, 811, 851) is provided in the region (S2, S202, S302, S402, S502, S602, S802, S902, S1002, S1102) overlapping the substrate in addition to the substrate outer region (S1, S201, S301, S401, S501, S601, S801, S901, S1001, S1101) when viewed from the direction normal to the card surface.

A third aspect provides the card according to the first or second aspect, wherein the thickness adjustment layer (11, 51, 211, 251, 311, 351, 411, 451, 551, 651, 751, 811, 851) has a thickness providing close contact between a pressing plate and the upper layer as well as close contact between a pressing plate and the lower layer during pressing.

A fourth aspect provides the card according to any one of the first to third aspects, wherein an electronic component (32, 232, 432, 532, 632, 732) is mounted on the substrate (30, 230, 430, 530, 630, 730), and a spacer sheet (20, 40, 240, 420, 440, 520, 540, 620, 640, 720, 740) is disposed between the upper layer (50, 250, 450, 550, 650, 750, 850, 950, 1050, 1150) and the lower layer (10, 210, 410, 510, 610, 710, 810, 910, 1010, 1110), the spacer sheet having a penetration hole (20a, 40a, 240a) or a cutout allowing the electronic component to escape therein, the outline of the spacer sheet having the same size as the upper layer and the lower layer.

A fifth aspect provides the card according to the fourth aspect, wherein the thickness adjustment layer (411, 451, 651, 811, 851) is provided on the spacer sheet (420, 440, 640, 20, 40).

A sixth aspect provides the card according to any one of the first to fifth aspects, wherein the thickness adjustment layer (11, 51, 211, 251, 311, 351, 411, 451, 551, 651, 751, 811, 851) is provided on the entire circumference of the layer (10, 50, 210, 250, 310, 350, 420, 440, 550, 640, 750, 20, 40) provided with the thickness adjustment layer.

The seventh aspect provides a card production method for the card according to any one of the first to sixth aspects including a laminating step (#1) for laminating the substrate (30, 230, 330, 430, 530, 630, 730) and the layers, and a pressing step (#2) for sandwiching the upper layer (50, 150, 250, 350, 450, 550, 650, 750, 850, 950, 1050, 1150) and the lower layer (10, 110, 210, 310, 410, 510, 610, 710) laminated in the laminating step between pressing plates (81, 82), in the up-and-down direction, so as to perform pressing by ensuring close contact between the pressing plate and the upper layer as well as close contact between the pressing plate and the lower layer.

The eighth aspect provides the card production method according to the seventh aspect, wherein an electronic component (32, 232, 432, 532, 632, 732) is mounted on the substrate (30, 230, 430, 530, 630, 730), and the pressing step (#2) includes a heating step (#2a) for heating at least one of a contact layer (50, 250, 450, 550, 650, 750) making contact with the electronic component and a contact layer making contact with a portion of the substrate that is a region (10, 210, 410, 510, 610, 710) embedded with the electronic component until the contact layer is softened, and an electronic component embedding step (#2b) for embedding the electronic component in the contact layer by gradually increasing the pressure applied on the contact layer that is softened in the heating step.

The ninth aspect provides the card production method according to the fifth or sixth aspect, wherein the card (1, 201, 301, 401, 501, 601, 701) produced in multiple layouts.

Effects of the Invention

The present invention provides a card capable of improving external appearance, and a card production method.

BRIEF DESCRIPTION OF THE DRAWINGS

FIG. 8 depicts the laminate-structure of the card 201 according to a second embodiment.

FIGS. 9A to 9C depict a production step of the card 201 according to the second embodiment.

FIG. 11 depicts the laminate-structure of the card 401 according to a fourth embodiment.

FIG. 13 depicts the laminate-structure of the card 601 according to a sixth embodiment.

FIG. 14 depicts the laminate-structure of the card 701 according to a seventh embodiment.

FIG. 15 depicts the laminate-structure of the card 801 according to an eighth embodiment.

FIG. 18 depicts the laminate-structure of the card 901 according to a ninth embodiment.

FIG. 19 depicts the laminate-structure of the card 1001 according to a tenth embodiment.

EXPLANATION OF REFERENCE NUMERALS

Figure 1A:
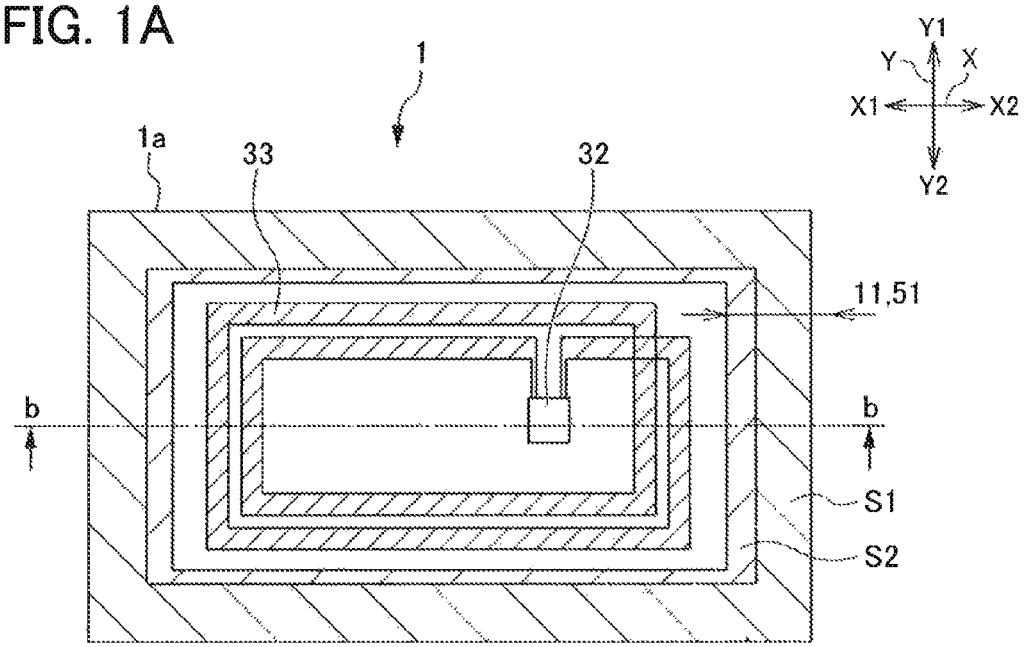
FIGS. 1A and 1B illustrate a plan view and a cross-sectional view of the card 1 according to a first embodiment.

1, 101, 201, 301, 401, 501, 601, 701, 801, 901, 1001, 1101 card
2, 102, 202, 302 laminated body
10, 110, 210, 310, 410, 510, 610, 710, 810, 910, 1010, 1110 lower layer
20, 120, 420, 520, 620, 720 lower spacer sheet
30, 130, 230, 330, 430, 530, 630, 730 module substrate
32, 132, 232, 332, 432, 532, 632, 732 IC chip
33, 133, 233, 333, 433, 533, 633, 733 antenna coil
40, 140, 240, 440, 540, 640, 740 upper spacer sheet
50, 150, 250, 350, 450, 550, 650, 750, 850, 950, 1050, 1150 upper layer
11, 51, 211, 251, 311, 351, 411, 451, 551, 651, 751, 811, 851 thickness adjustment layer
81, 82 heat pressing plate

PREFERRED MODE FOR CARRYING OUT THE INVENTION

First Embodiment

Figure 1B:
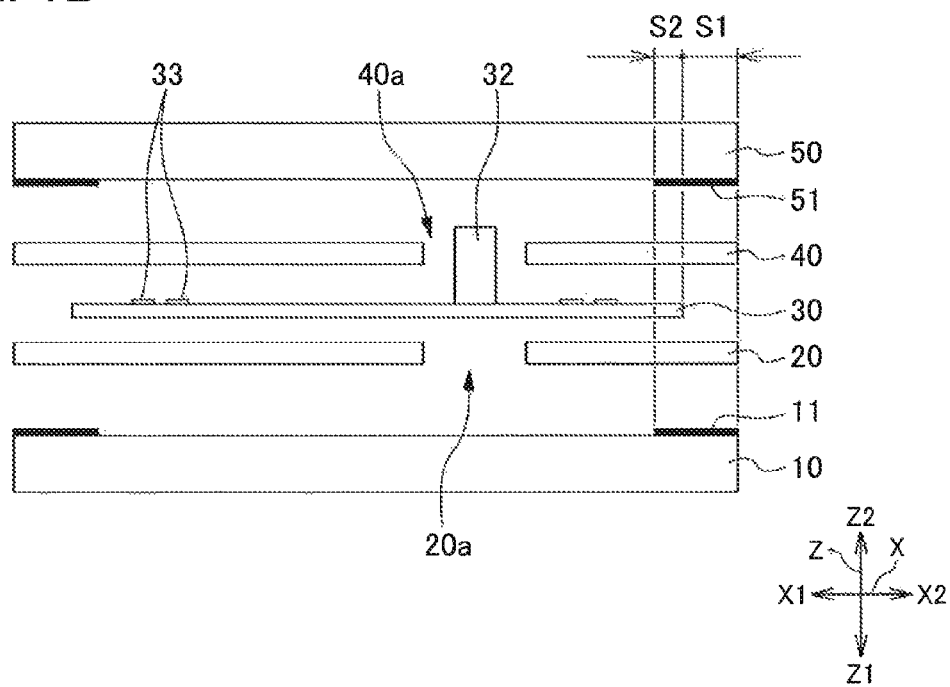

A first embodiment of the present invention will be described below referring to the drawings FIGS. 1A and 1B illustrate a plan view and a cross-sectional view of the card 1 according to the first embodiment.

FIG. 1A is a plan view of the card 1.

FIG. 1B is a cross-sectional view (cross-sectional view taken along the section b-b in FIG. 1A) depicting the laminate-structure of the card 1 before each layer is bonded.

In the embodiment and the drawing, the direction normal to the card surface is defined as the up-and-down direction Z, and the figure viewed from the direction Z is defined as the plan view. In the plan view of the card 1, the direction along the longer side is defined as the right-and-left direction X and the direction along the shorter side is defined as the longitudinal direction Y. The shape in the plan view is referred to as a plane shape as required.

Note that to clearly illustrate the configuration in each drawing, dimensions may be magnified in directions such as in the up-and-down direction Z (thickness direction) as required. Furthermore, to clearly explain the internal configuration in the plan view, the view is illustrated in a transparent manner so that the internal components can be seen.

The card 1 is a thin IC card having a thickness of about 0.3 mm. For example, the card 1 is a prepaid card.

The card 1 is formed by laminating, from the lower side Z1, a lower layer 10, a lower spacer sheet 20, a module substrate 30 (substrate), an upper spacer sheet 40, and an upper layer 50.

The lower layer 10, the lower spacer sheet 20, the upper layer sheet 40, and the upper layer 50 each have a rectangular plane shape of the same size that is identical to the card outline 1a. The lower spacer sheet 20 and the upper spacer sheet 40 are the same component (the same material and the same shape).

The module substrate 30 has a rectangular plane shape smaller than the lower spacer sheet 20 and the upper spacer sheet 40. The module substrate 30 is laminated between the lower spacer sheet 20 and the upper spacer sheet 40 so as that a substrate outer region S1, which is the region around the outline of the module substrate 30 having an approximately constant width, is provided.

Heat pressing is performed to bond between each of the layers. The material and thickness of each layer are as described below.

lower layer 10: PET-G, 80 µm
lower spacer sheet 20 and upper spacer sheet 40: PET-G, 40 µm
module substrate 30: PET, 45 µm
upper layer 50: PET-G, 80 µm Each layer may be configured by laminating a plurality of sheets instead of a single sheet material.

On the bottom surface of the lower layer 10, printing (not shown in the drawing) related to the card 1 is applied.

The lower layer 10 includes a thickness adjustment layer 11.

The thickness adjustment layer 11 is a print layer formed on the entire circumferential of the edge of the top surface of the lower layer 10 by silk screen printing. In the plan view, the area where the thickness adjustment layer 11 is printed ranges from the card outline 1a to the inner side of the module substrate 30. That is, the thickness adjustment layer 11 is printed on the substrate outer region S1 and an overlapping region S2, located in the inner side of the substrate outer region S1, where the lower layer 10 and the module substrate 30 overlap.

The lower spacer sheet 20 includes a hole 20a.

The hole 20a is a penetration hole penetrating the lower spacer sheet 20 in the up-and-down direction Z. The hole 20a reduces the pressure applied to an IC chip 32, thereby suppressing damage to the IC chip 32. The hole 20a is provided in the area corresponding to the IC chip 32 (described below).

The module substrate 30 includes electronic components such as the IC chip 32 or the like and an antenna coil 33.

The IC chip 32 is a semiconductor integrated circuit element storing data such as an amount remaining, identification information, or the like. The it chip 32 communicates with an external reader/writer (not shown in the drawing) to perform rewriting of the amount remaining or the like. The thickness of the IC chip 32 is 120 μm. The IC chip 32 is mounted on the top surface of the module substrate 30. The IC chip 32 is mechanically and electrically connected to the antenna coil 33 of the module substrate 30 by a gold bump or the like.

The antenna coil 33 is a loop-coil antenna allowing the IC chip 32 to communicate with an external reader/writer (not shown, in the drawing). The antenna coil 33 is a conductor formed on the top surface of the module substrate 30 by a method such as etching. The antenna coil 33 produces a current by the magnetic field generated by the reader/writer when the card 1 is placed above the reader/writer and supplies power to the IC chip 32. In this manner, the IC chip 32 performs wireless transmission of information between the reader/writer.

The upper spacer sheet 40 includes a hole 40a similar to the hole 20a of the lower spacer sheet 20.

Similarly to the bottom surface of the lower layer 10, information related to the card 1 is printed on the top surface of the upper layer 50.

The upper layer 50 includes a thickness adjustment layer 51.

The thickness adjustment layer 51 is a print layer formed on the bottom surface of the upper layer 50 by silk screen printing.

Similarly to the thickness adjustment layer 11 of the lower layer 10, the thickness adjustment layer 51 is provided in the substrate outer region S1 and the overlapping region S2 in the plan view.

As will be described below, the thickness adjustment layers 11 and 51 are effective in reducing production time and improving external appearance of the card 1.

Now, the production step of the card 1 will be described.

Figure 2:
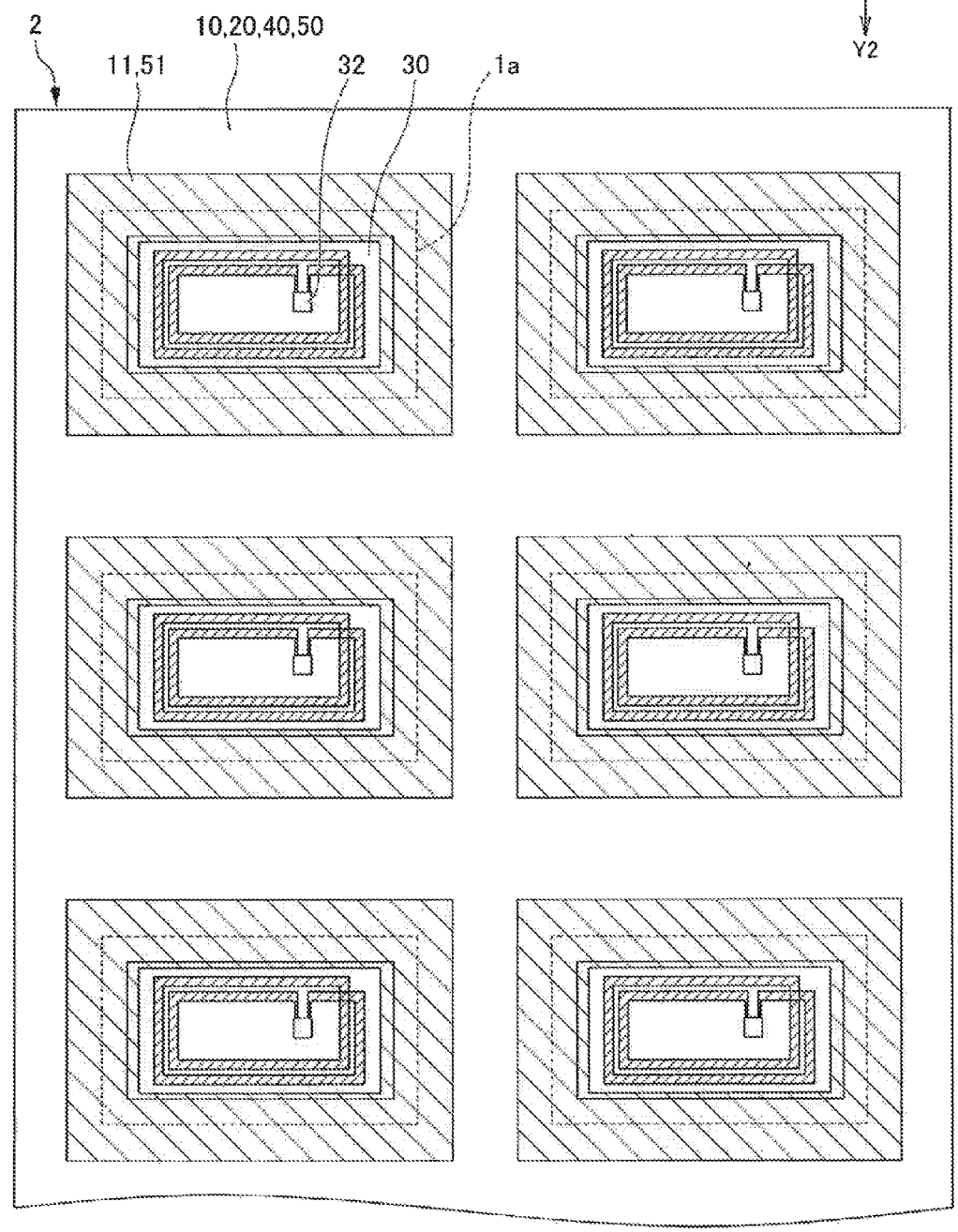
FIG. 2 is a plan view depicting the shape of multiple layouts of the card 1 according to the first embodiment.

FIG. 2 illustrates a plan view depicting the shape of multiple layouts of the card 1 according to the first embodiment.

FIGS. 3A, 3B, 4C, 4D, 5E, and 5F are cross-sectional views depicting a production step of the card 1 according to the first embodiment.

Figure 6:
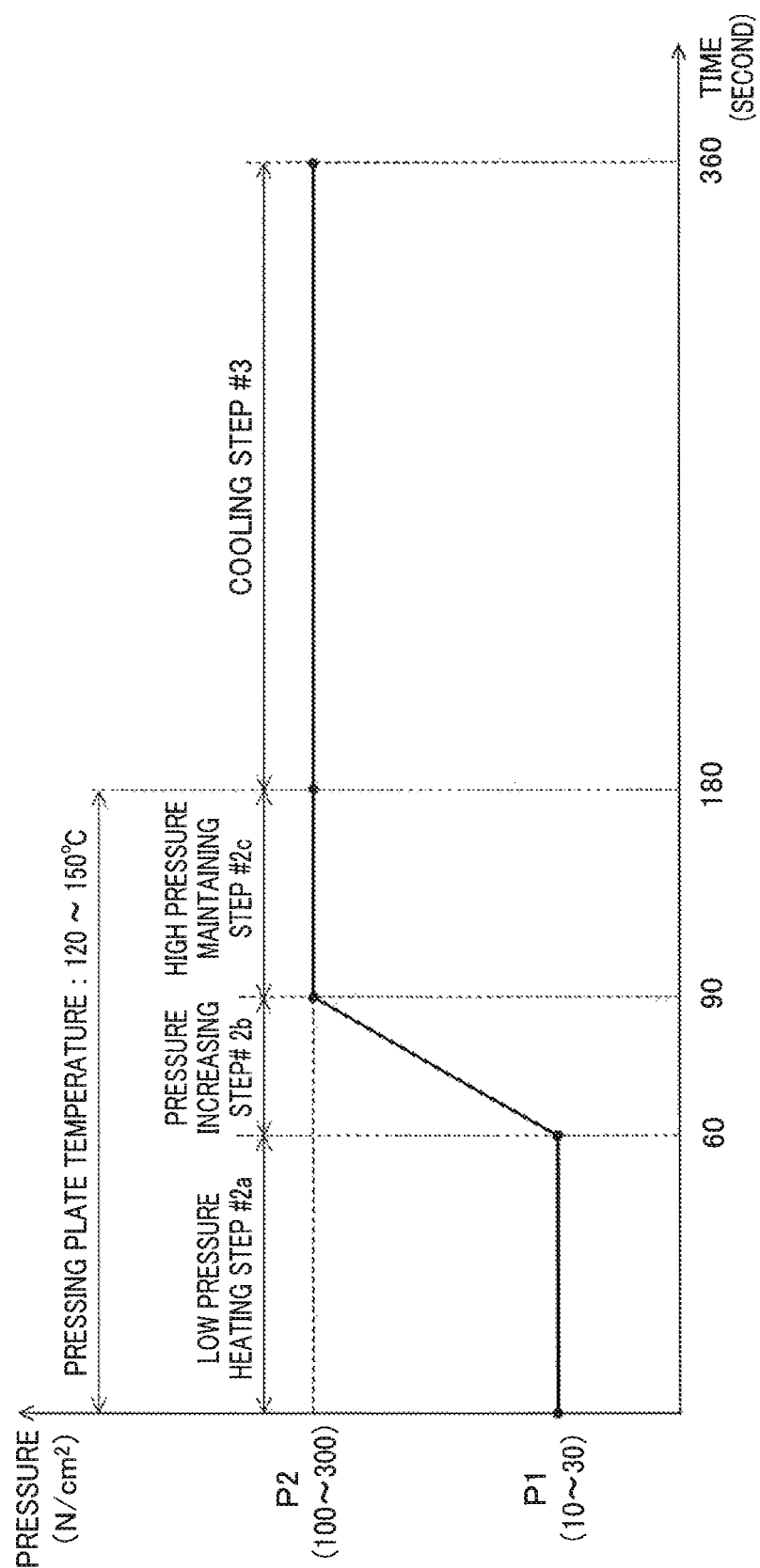
FIG. 6 is a chart illustrating the pressing and heating conditions of the heat pressing of the first embodiment.

FIG. 6 is a chart illustrating the pressing and heating conditions of the heat pressing of the first embodiment.

As illustrated in FIG. 2, the card 1 is produced in multiple layouts using the lower layer 10, the lower spacer sheet 20, the upper spacer sheet 40, and the upper layer 50, each formed of a sheet larger than the card outline 1a.

The area where each of the thickness adjustment layers 11 and 51 are printed is larger than the card outline 1a. This is for improving production efficiency by lowering the accuracy required for positioning the print location of the thickness adjustment layers 11 and 51.

To simplify the description, a form of producing a single card 1 will be described below.

The card 1 is produced by the following step performed by a worker or a heat pressing machine.

Laminating Step #1

Figure 3A:
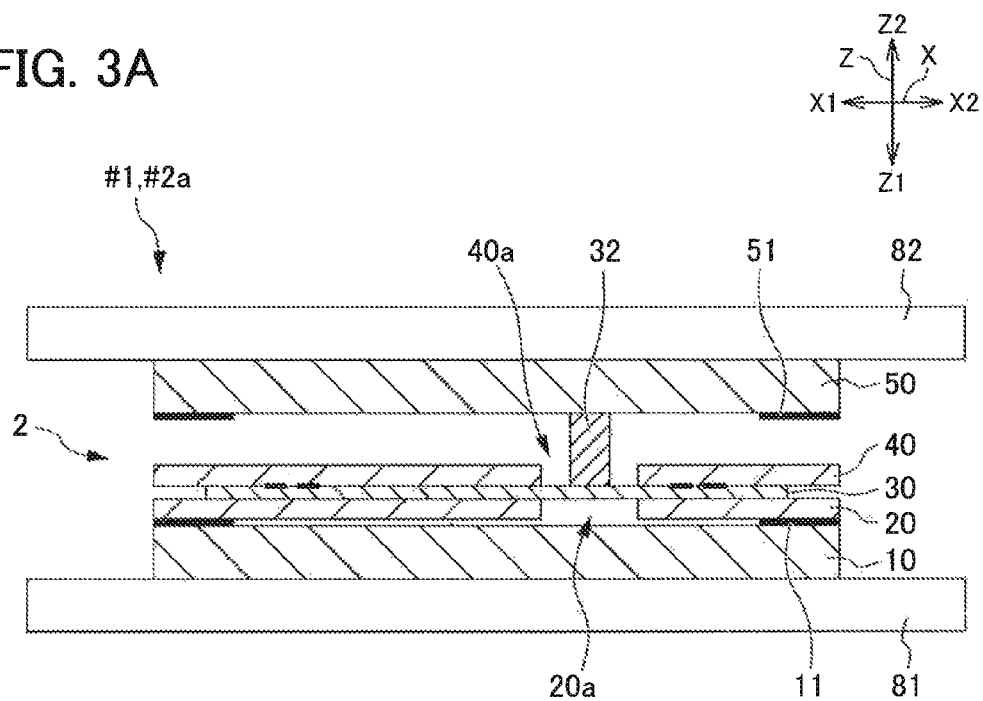
FIGS. 3A and 3B are cross-sectional views depicting a production step of the card 1 according to the first embodiment.

As illustrated in FIG. 3A, the lower layer 10, the lower spacer sheet 20, the module substrate 30, the upper spacer sheet 40, and the upper layer 50 are laminated in this order on a heat pressing plate 81 to form a laminated body 2.

Heat Pressing Step #2

As illustrated in FIG. 3A, in the heat pressing step #2, the laminated body 2 is sandwiched between the heat pressing plates 81 and 82 and then the following steps are sequentially performed.

The heat pressing plates 81 and 82 are kept at the temperature of 120° C. to 150° C. throughout the heat pressing step #2 (see FIG. 6).

Low Pressure Heating Step #2a

As illustrated in FIG. 3A, the lower layer 10 and the upper layer 50 are pressed with low pressure P1 (see FIG. 6) and simultaneously heated by the heat pressing plates 81 and 82 to soften them.

The low pressure P1 is such that keeps the surface contact between the lower layer 10 and the heat pressing plate 81 and the surface contact between the upper layer 50 and the heat pressing plate 82, and is able to transfer heat from the heat pressing plates 81 and 82 to the lower layer 10 and the upper layer 50. The low pressure P1 is set to be within 10 to 30 mN/cm$^2$.

Pressure Increasing Step #2b (Electronic Component Embedding Step)

As illustrated in FIG. 6, the pressing pressure of the heat pressing plates 81 and 82 is gradually increased from the low pressure P1 to the high pressure P2. The high pressure P2 is set to be within 100 to 300 N/cm$^2$.

Figure 3B:
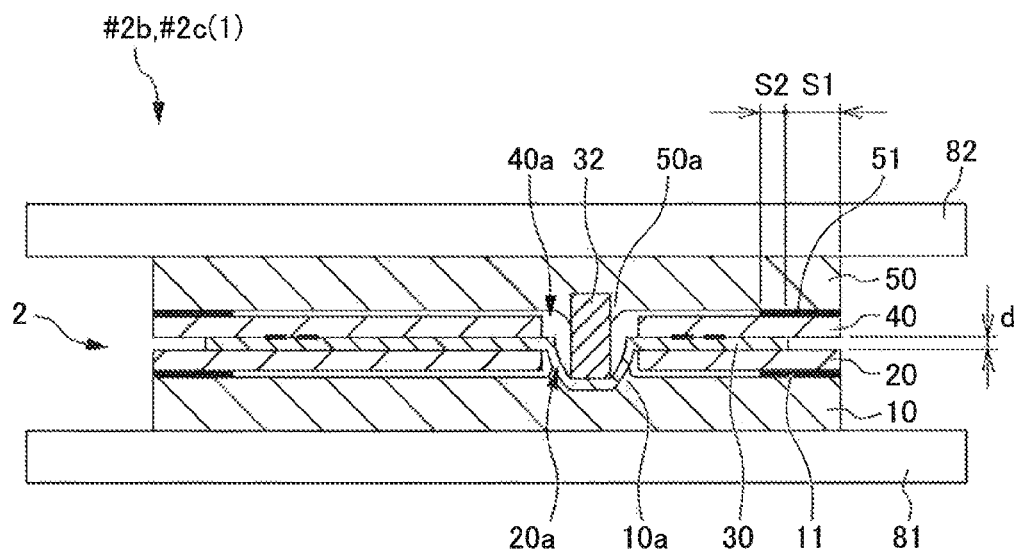

As illustrated in FIG. 3B, in the pressure increasing step #2b, the portion that is a part of the top surface of the lower layer 10 (contact layer) already softened in the low pressure heating step #2b and is in contact with the region of the module substrate 30 where the IC chip 32 is mounted deforms. Similarly, the portion that is a part of the bottom surface of the upper layer 50 (contact layer) and is in contact with the IC chip 32 deforms. In this manner, the IC chip 32 is embedded in the lower layer 10 and the upper layer 50.

Note that, in the embodiment, the contact layer is not limited to the upper layer 50 that is in contact with the IC chip 32 itself or the electronic component, and may be the lower layer 10 that is in contact with the region of the module substrate 30 where the IC chip 32 is mounted.

Materials 10*a* and 50*a* of the lower layer 10 and the upper layer 50, which are initially provided in the portion where the IC chip 32 is embedded, are pushed out by the IC chip 32 to be contained in the holes 20*a* and 40*a* of the lower spacer sheet 20 and the upper spacer sheet 40, respectively.

In this manner, distortion around the circumference of the IC chip 32 created on the bottom surface of the lower layer 10 and the top surface of the upper layer 50, which are card surfaces, can be reduced so that flatness can be improved, thereby improving the external appearance of the card 1. Furthermore, since the flatness of the bottom surface of the lower layer 10 and the top surface of the upper layer 50 can be improved, concentration of the pressure on the IC chip 32 can be suppressed in the following pressing step, therefore, damage to the IC chip 32 can be suppressed.

High Pressure Maintaining Step #2*c*

As illustrated in FIG. 6, the high pressure maintaining step #2*c* maintains the state of heating with high pressure in which the heat pressing plates 81 and 82 are kept at the temperature of 135° C. and the pressure is kept at the high pressure P2.

In the high pressure maintaining step #2*c*, the state between layers changes as described below.

(1) As illustrated in FIG. 3B, when the IC chip 32 is further embedded, each gap between the layers in the overlapping region S2 decreases and the layers contact each other. That is, in the overlapping region S2, the lower layer 10, the thickness adjustment layer 11, the lower spacer sheet 20, the module substrate 30, the upper spacer sheet. 40, the thickness adjustment layer 51, and the upper layer 50 make contact. In this state, the gap d between the lower spacer sheet 20 and the upper spacer sheet 40 is same as the thickness of the module substrate 30, that is, 45 µm.

These layers may make contact in the pressure increasing step #2*b* or the low pressure heating step #2*a*, instead of the high pressure maintaining step #2*c*. Whether the contact is made in the step in which the pressing pressure increases toward the high pressure P2 or after reaching the high pressure P2, depends on the conditions.

Figure 4C:
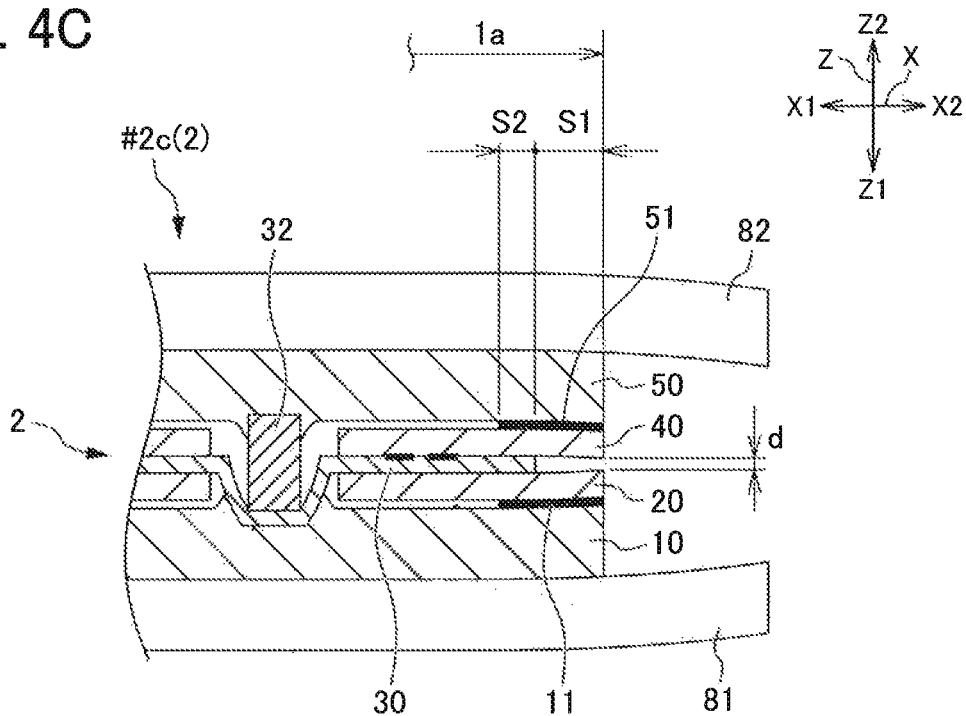
FIGS. 4C and 4D are cross-sectional views depicting a production step of the card 1 according to the first embodiment.

(2) As illustrated in FIG. 4C, the gap d gradually Decreases. It can be understood that the gap d decreases because the heat pressing plates 81 and 82 have started deforming in the vicinity of the card outline 1*a*, causing the lower layer 10 and the lower spacer sheet 20 to deform upward in the Z2 direction, and the upper spacer sheet 40 and the upper layer 50 to deform downward in the Z1 direction.

Figure 4D:
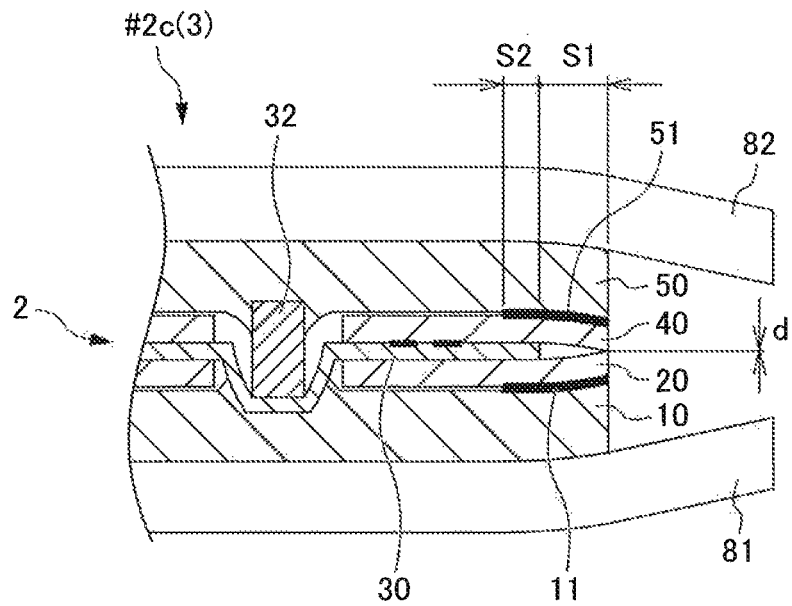

(3) As illustrated in FIG. 4D, when the gap d is zero, the outer edges of the lower spacer sheet 20 and the upper spacer sheet 40 come into contact with each other.

Figure 5E:
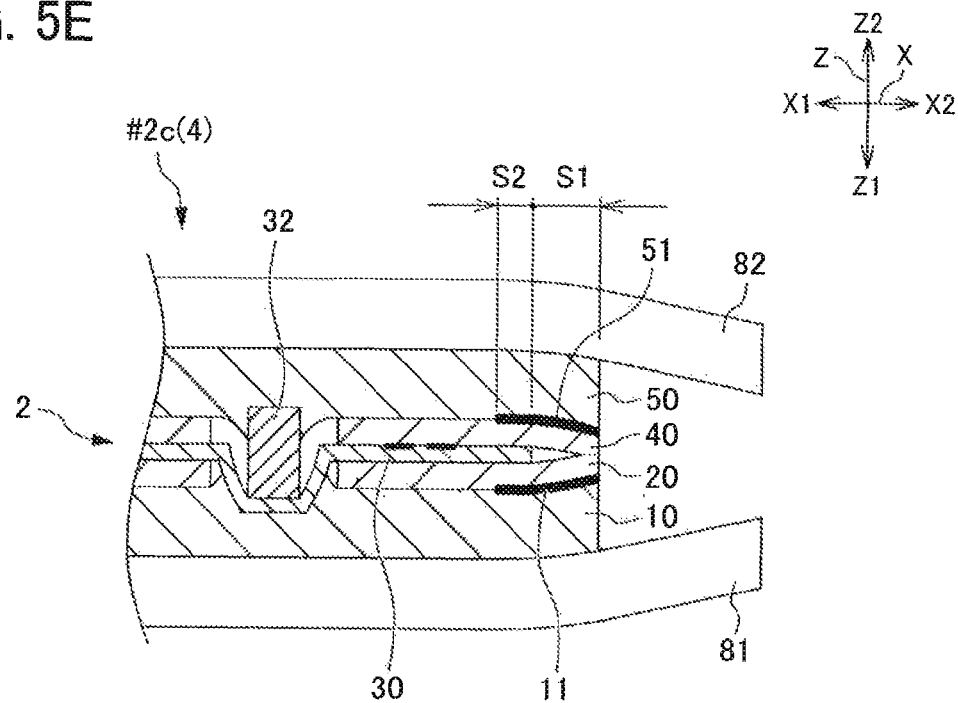
FIGS. 5E and 5F are cross-sectional views depicting a production step of the card 1 according to the first embodiment.

(4) As illustrated in FIG. 5E, thermal bonding starts at the outer edge of the substrate outer region S1.

In the substrate outer region S1 and the overlapping region S2, each layer is thermally bonded as described below.

The lower spacer sheet 20 and the upper spacer sheet 40 (PET-G) are suitable for thermally bonding together and therefore are tightly bonded.

The lower layer 10 and the lower spacer sheet 20 are bonded via the thickness adjustment layer 11. That is, a coating material suitable for thermally bonding to the lower layer 10 and the lower spacer sheet 20 (PET-G) is used as the thickness adjustment layer 11. The thickness adjustment layer 11 is compressed by pressing or embedded in the lower layer 10 and the lower spacer sheet 20.

Similarly to the lower layer 10 and the lower spacer sheet 20, the upper layer 50 and the upper spacer sheet 40 are bonded via the thickness adjustment layer 51.

However, the module substrate 30 (PET) is not suitable for thermally bonding to the lower spacer sheet 20 and the upper spacer sheet 40 (PET-G). So that in the card 1, the module substrate 30 is enclosed and supported between the lower spacer sheet 20 and the upper spacer sheet 40 by bonding the portions of the lower spacer sheet 20 and the upper spacer sheet 40 in the substrate outer region S1.

Figure 5F:
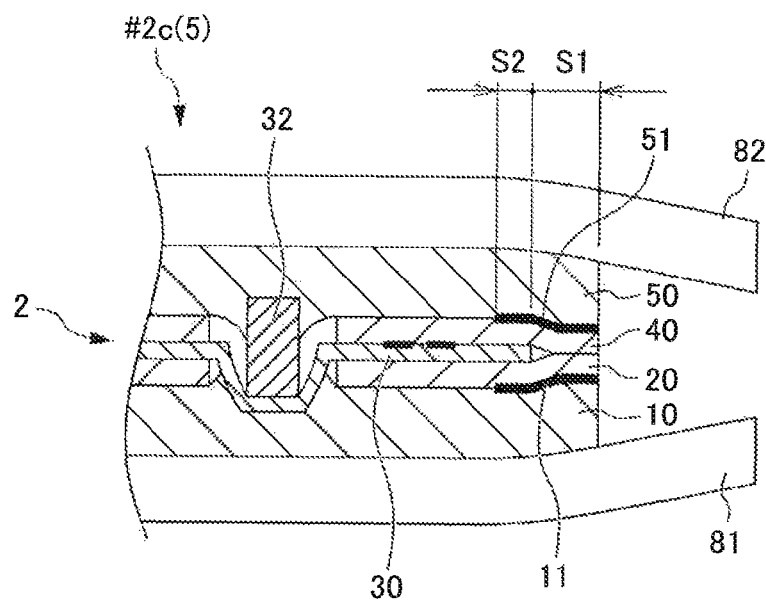

(5) As illustrated in FIG. 5F, when the pressing with the high pressure P2 continues, the bonded area of the layers increases in the substrate outer region S1, and consequently, the majority of the substrate outer region S1 is bonded.

The pressing state in the overlapping region S2 and the substrate outer region S1, and the effect of the thickness adjustment layers 11 and 51, in the steps (1) to (5) are as described below.

Pressing State in Overlapping Region S2

Except the region where the IC chip 32 is provided, the overlapping region S2 including the thickness adjustment layers 11 and 51 has the greatest thickness. Therefore, the overlapping region S2 is most likely to receive high pressure.

Pressing State in Substrate Outer Region S1

Since the substrate outer region S1 is adjacent to the overlapping region S2, the substrate outer region S1 is likely to receive pressure from the heat pressing plates 81 and 82. Therefore, the heat pressing plates 81 and 82 can stably deform the lower layer 10 and the upper layer 50 so as to close the gap d. Furthermore, since the thickness adjustment layers 11 and 51 increase the thickness, the lower spacer sheet 20 and the upper spacer sheet 40 stably make contact to raise the contact pressure after the gap d has become zero. In this manner, the pressing and heating between the layers in the substrate outer region S1 can be improved.

Cooling Step #3

As illustrated in FIG. 6, when the high pressure maintaining step #2*c* is complete, the heating of the heat pressing plates 81 and 82 ceases but the pressure of the heat pressing plates 81 and 82 is kept at the high pressure P2, and the laminated body 2 is cooled.

As illustrated in FIG. 6, the required time for each of the heat pressing step #2 and the cooling step #3 is as described below, low pressure heating step #2*a* (heating step): 60 seconds pressure increasing step #2*b* (pressure on electronic component increasing step): 30 seconds high pressure maintaining step #2*c*: 90 seconds cooling step #3: 180 seconds (3 minutes)

total: 6 minutes.

Card Cutting Step #4

The laminated body 2 is removed from the heat pressing plates 81 and 82 and then cut into pieces. In this manner, the card 1 is produced.

Comparing Production Time and External Appearance with Comparative Example

A card 101 is produced as a comparative example to compare the production time and external appearance with the card 1 according to the first embodiment. The portion of the card 101 as a comparative example having the same function as the card 1 according to the first embodiment is appended with the same reference sign or a reference sign including the same reference sign in the right hand digit or digits, and any repeated explanation is suitably omitted.

FIGS. 7A to 7D illustrate cross-sectional views depicting a production step of the card 101 as a comparative example.

Figure 7A:
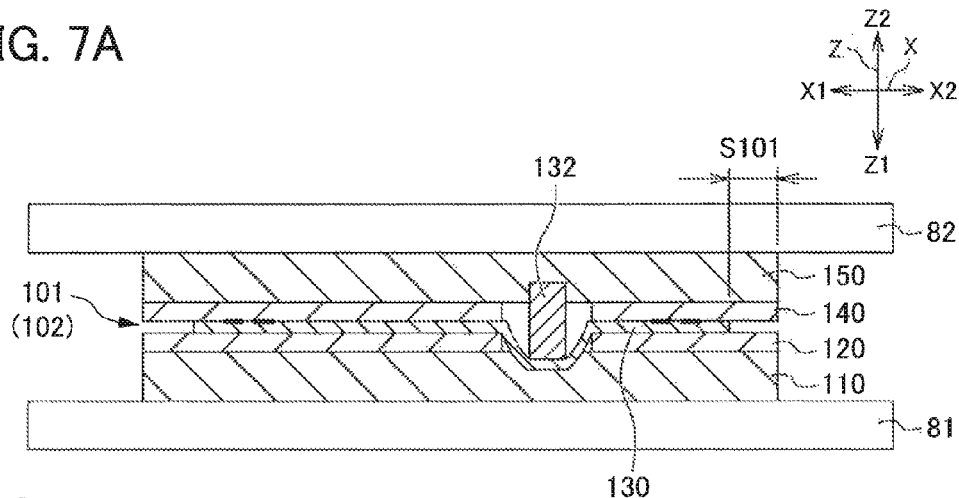
FIGS. 7A to 7D are cross-sectional views depicting a production step of a card 101 as a comparative example.
Figure 7B:
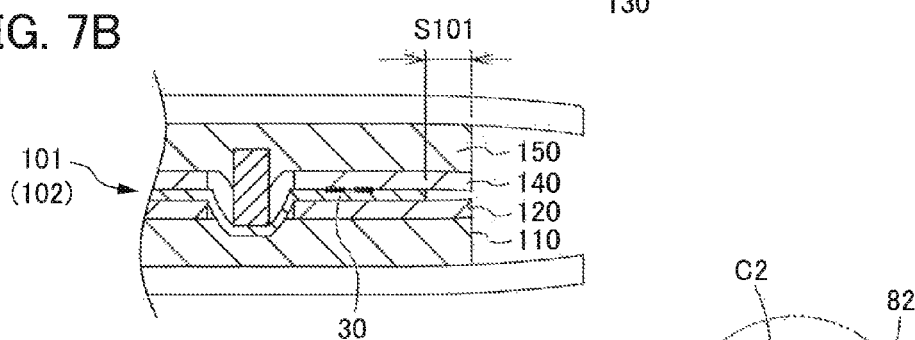
Figure 7C:
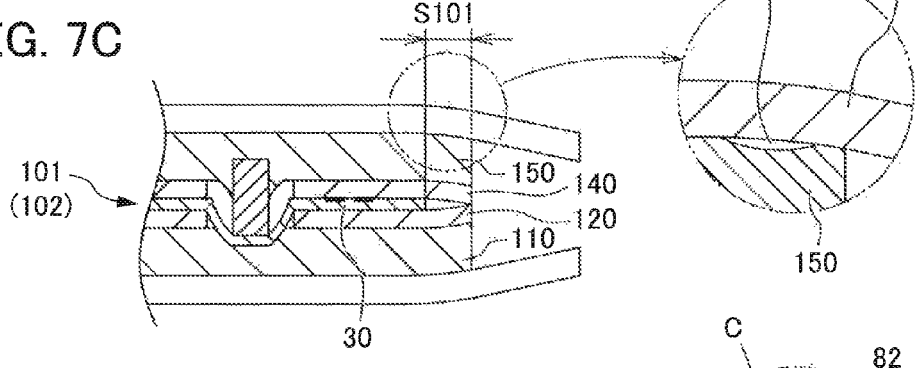
Figure 7D:
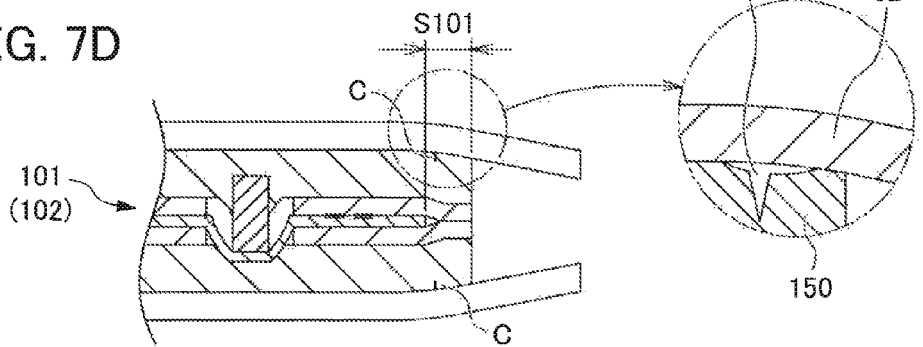

FIG. 7A corresponds to FIG. 3B.
FIG. 7B corresponds to FIG. 4C.
FIG. 7C corresponds to FIG. 4D.
FIG. 7D corresponds to FIG. 5F.

As illustrated in FIG. 7A, a lower layer 110 and an upper layer 150 of the card 101 as a comparative example are not provided with a thickness adjustment layer. Other configuration is same as the first embodiment. As for the production step, the time required for each of the heat pressing step #2 and the cooling step #3 is adjusted so as to avoid poor external appearance.

Production Time

The production time of the card 101 as a comparative example is as described below.
low pressure heating step: 180 seconds
pressure increasing step: 30 seconds
high pressure maintaining step: 240 seconds
cooling step: 7 minutes and 30 seconds
total: 15 minutes Here, the pressing pressure is set to 20 N/cm$^2$ for the low pressure and 160 N/cm$^2$ for the high pressure.

The production time of the card 101 as a comparative example is significantly longer than 6 minutes, which is the production time for the first embodiment.

External Appearance

As illustrated in FIG. 7D, in some cases for the card 101 as a comparative example, a recess C looking like a flaw is formed on the card surface, that is, the bottom surface of the lower layer 110 and the top surface of the upper layer 150.

Contrarily, as for the card 1 according to the first embodiment, no recess is formed on the bottom surface of the lower layer 10 and the top surface of the upper layer 50.

As described above, the production time and external appearance of the card 101 as a comparative example are not good compared to the card 1 according to the first embodiment.

The reason is understood as described below. Since the card 101 as a comparative example does not include the thickness adjustment layer, the pressure from the heat pressing plates 81 and 82 is not suitably applied in the substrate outer region S101 compared to the first embodiment. Therefore, in the substrate outer region S101 during the heat pressing, the heat pressing plates 81 and 82 do not deform as much so that the effect of deforming the lower layer 110, the lower spacer sheet 120, the upper spacer sheet 140, and the upper layer 150 is smaller than the first embodiment.

So that, in the step illustrated in FIGS. 7B and 7C, it takes a longer time than the first embodiment for the lower spacer sheet 120 and the upper spacer sheet 140 to make contact with each other. Moreover, after the lower spacer sheet 120 and the upper spacer sheet 140 have made contact with each other, the pressure is not sufficiently applied between the lower layer 110, the lower spacer sheet 120, the upper spacer sheet 140, and the upper layer 150 in the substrate outer region S101, so that a longer time is required to thermally bond between the layers.

When the pressure from the heat pressing plates 81 and 82 decreases in the substrate outer region S101, the heat pressing plates 81 and 82 do not deform as much, which is likely to result in generation of a gap between the heat pressing plate 81 and the lower layer 110 and generation of a gap C2 (see FIG. 7C) between the heat pressing plate 82 and the upper layer 150. When the gap C2 is generated and when thermal contraction occurs on the bottom surface of the lower layer 110 and the top surface of the upper layer 150, the distortion (recess C) caused by the thermal contraction appears like a linear flaw. To prevent causing the distortion, the lower layer 110 and the upper layer 150 need to be heated slowly, which requires a longer step time.

Meanwhile, the card 1 according to the first embodiment includes the thickness adjustment layers 11 and 51 so that the pressure is sufficiently applied by the heat pressing plates 81 and 82. Therefore, the pressure applied to the lower layer 10 from the heat pressing plate 81 can be kept at a certain degree, and also the pressure applied to the upper layer 50 from the heat pressing plate 82 can be kept at a certain degree. Therefore, the heat pressing plate 81 and the lower layer 10 can be kept in close contact, and also the heat pressing plate 82 and the upper layer 50 can be kept in close contact. As for the card 1, as described above, even when thermal contraction occurs by rapidly heating the bottom surface of the lower layer 10 and the top surface of the upper layer 50, the formation of a recess can be suppressed and the step time can be reduced.

Here, the thickness of each of the thickness adjustment layers 11 and 51 according to the first embodiment is 5 to 7 µm so that the total thickness of the thickness adjustment layers is 10 to 14 µm. Therefore, the gap d, which is 45 µm, still has a gap of 30 µm or more even when the thickness of each of the thickness adjustment layers 11 and 51 is taken into account. However, by comparing the production time and external appearance with the comparative example, it is confirmed that the thickness adjustment layers 11 and 51 are sufficiently effective in reducing production time and improving external appearance, even with the total thickness of 10 to 14 µm.

As described above, the card 1 according to the first embodiment can reduce the possibility o forming poor external appearance and reduce the production time, thereby improving production efficiency.

Furthermore, as for the card 1 according to the embodiment, since the thickness adjustment layers 11 and 51 overlap the module substrate 30, the contact pressure in the substrate outer region S1 can be further increased so that production efficiency can be further increased.

Second Embodiment

Now, a second embodiment of the present invention will be described.

In the description and the drawing of the embodiment below, the portion having the same function as the first embodiment described above is appended with the same reference sign or a reference sign including the same reference sign in the right hand digit or digits, and any repeated explanation is suitably omitted.

FIG. 8 depicts the laminate-structure of a card 201 according to the second embodiment.

FIGS. 9A to 9C depict a production step of the card 201 according to the second embodiment.

FIG. 9A corresponds to FIG. 4C.
FIG. 9B corresponds to FIG. 4D.
FIG. 9C corresponds to FIG. 5F.

As illustrated in FIG. 8, the card 201 does not include the upper spacer sheet since the IC chip 232 is thinner than the first embodiment.

As illustrated in FIG. 9A, in the high pressure maintaining step, the laminated body 202 is sandwiched between the heat pressing plates 81 and 82.

As illustrated in FIGS. 9B and 9C, from the outer circumference of the substrate outer region S201, a lower layer 210 and an upper spacer sheet 240 are thermally bonded by a thickness adjustment layer 211, and the upper spacer sheet 240 and the upper layer 250 are thermally bonded by a thickness adjustment layer 251.

In this step, similarly to the first embodiment, the pressure from the heat pressing plates 81 and 82 is sufficiently applied to the laminated body 202 so that the contact pressure between the layers in the substrate outer region S201 can be increased.

In this manner, similarly to the first embodiment, the card 201 can improve production efficiency.

Third Embodiment

Now a third embodiment of the present invention will be described.

Figure 10A:
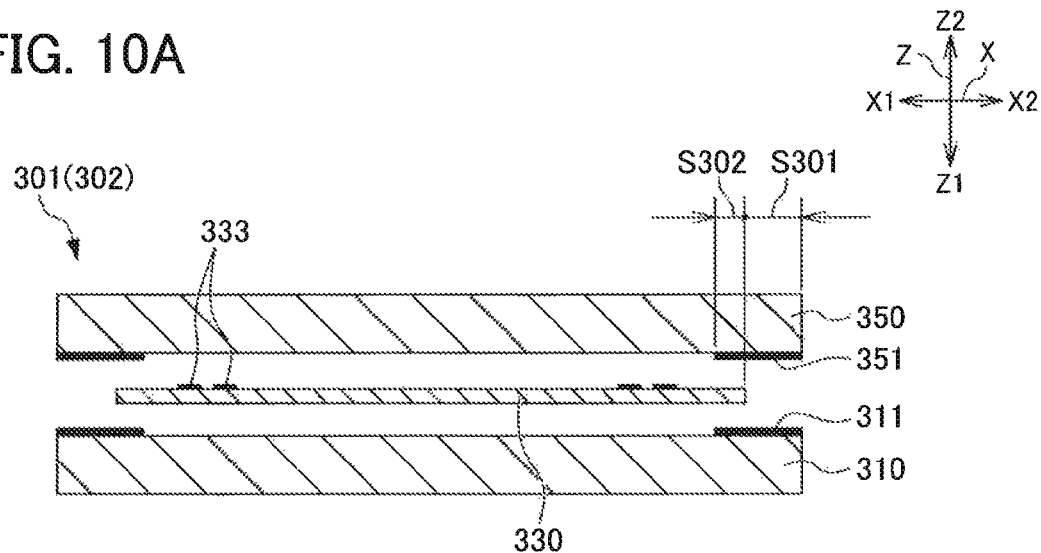
FIGS. 10A to 10C depict the laminate-structure and a production step of the card 301 according to a third embodiment.
Figure 10B:
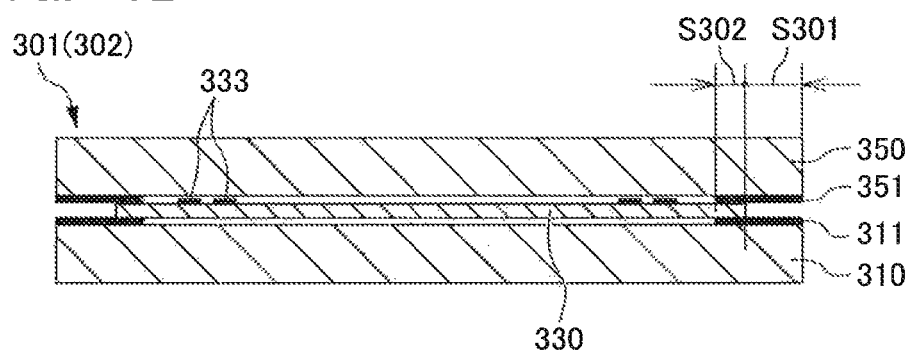
Figure 10C:
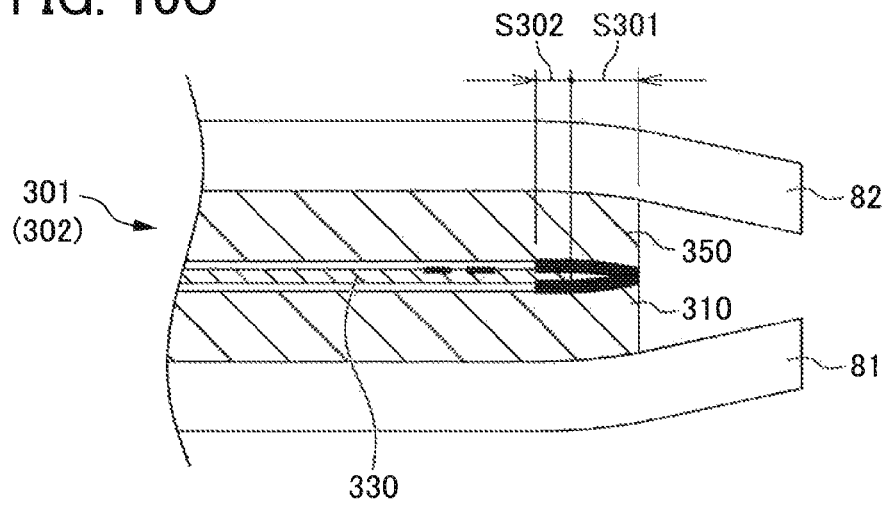

FIGS. 10A to 10C depict the laminate-structure and the production step of the card 301 according to the third embodiment.

As illustrated in FIG. 10A, only a wiring pattern 333 and a thin electronic component (not shown in the drawing) are mounted on a module substrate 330, but a thick electronic component such as an IC chip is not mounted. Therefore, the card 301 does not require the upper spacer sheet or the lower spacer sheet so that a lower layer 310 and an upper layer 350 are directly laminated on the module substrate 330.

Even in this case, the card 301 can increase the contact pressure between the lower layer 310 and the upper layer 350 in a substrate outer region S301 by the effect of thickness adjustment layers 311 and 351.

In this manner, similarly to the first embodiment, the card 301 can improve production efficiency.

Fourth Embodiment

FIG. 11 depicts the laminate-structure of the card 401 according to a fourth embodiment. On the top surface of the lower spacer sheet 420 and the bottom surface of the upper spacer sheet 440 of the card 401, thickness adjustment layers 411 and 451 are formed, respectively, by silk screen printing.

Even in this configuration of the card 401, similarly to the first embodiment, the pressure from the heat pressing plates 81 and 82 is sufficiently applied so that the contact pressure between the layers in the substrate outer region S401 can be increased.

In this manner, similarly to the first embodiment, the card 401 can improve production efficiency. Furthermore, the silk screen printing step can be provided for the lower spacer sheet 420 and the upper spacer sheet 440 in the production process as required.

Fifth Embodiment

Figure 12:
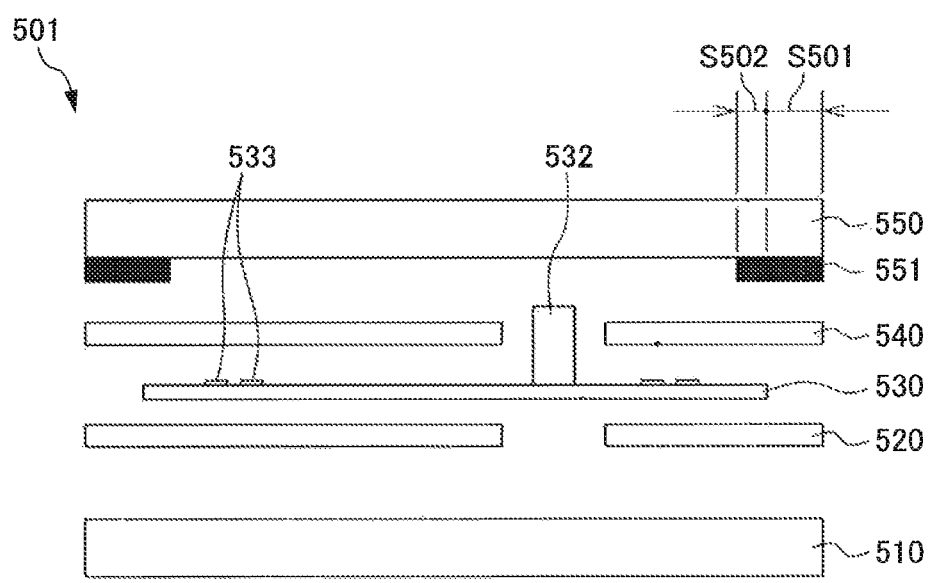
FIG. 12 depicts the laminate-structure of the card 501 according to a fifth embodiment.

FIG. 12 depicts the laminate-structure of the card 501 according to a fifth embodiment.

In the card 501, the thickness adjustment layer 551 is provided only on the bottom surface of the upper layer 550.

The thickness of the thickness adjustment layer 551 is about the total thickness of the thickness adjustment layers 11 and 51 according to the first embodiment.

Even in this configuration of the card 501, similarly to the first embodiment, the pressure from the heat pressing plates 81 and 82 is sufficiently applied so that the contact pressure between the layers in the substrate outer region S501 can be increased.

In this manner, similarly to the first embodiment, the card 501 can improve production efficiency. Furthermore, since the printing step is reduced, the production efficiency can be further improved.

Sixth Embodiment

FIG. 13 depicts the laminate-structure of the card 601 according to a sixth embodiment.

In the card 601, the thickness adjustment layer 651 is provided only on the top surface of the upper spacer sheet 640.

The thickness of the thickness adjustment layer 651 is about the total thickness of the thickness adjustment layers 11 and 51 according to the first embodiment.

Even in this configuration of the card 601, similarly to the first embodiment, the pressure from the heat pressing plates 61 and 82 is sufficiently applied so that the contact pressure between the layers in the substrate outer region S601 can be increased.

In this manner, similarly to the first embodiment, the card 601 can improve production efficiency. Furthermore, since the printing step is reduced, the production efficiency can be further improved, and also, the silk screen printing step can be provided in the production process as required.

Seventh Embodiment

FIG. 14 depicts the laminate-structure of the card 701 according to a seventh embodiment.

In the card 701, the thickness adjustment layer 751 is provided only on the bottom surface of the upper layer 750.

The thickness adjustment layer 751 is provided only in the substrate outer region S701. The thickness of the thickness adjustment layer 751 is about the total thickness of the thickness adjustment layers 11 and 51 according to the first embodiment.

Even in such a configuration of the card 701, similarly to the first embodiment, the contact pressure between the layers in the substrate outer region S701 can be improved, thereby improving external appearance and shortening production time. The effect is already confirmed by trial production.

In this manner, similarly to the first embodiment, the card 701 can improve production efficiency. Furthermore, since the printing step is reduced, the production efficiency can be further improved.

Eighth Embodiment

FIG. 15 depicts the laminate-structure of the card 801 according to an eighth embodiment.

As for the card 801, only the arrangement of thickness adjustment layers 811 and 851 is changed from the first embodiment. The thickness of each layer is the same as the first embodiment.

The thickness adjustment layer 811 is provided on the bottom surface of the lower spacer sheet 20 by silk screen printing.

Similarly, the thickness adjustment layer 851 is provided on the top surface of the upper spacer sheet 40. Considering mass production, the thickness of each of the thickness adjustment layers 811 and 851 is from 5 to 10 μm, providing a larger allowance range in thickness than the first embodiment.

Even in this case of the card 801, the contact pressure between the layers in the substrate outer region S801 can be increased by the effect of the thickness adjustment layers 811 and 851.

In this manner, similarly to the first embodiment, the card 801 according to the embodiment can improve production efficiency.

Figure 16:
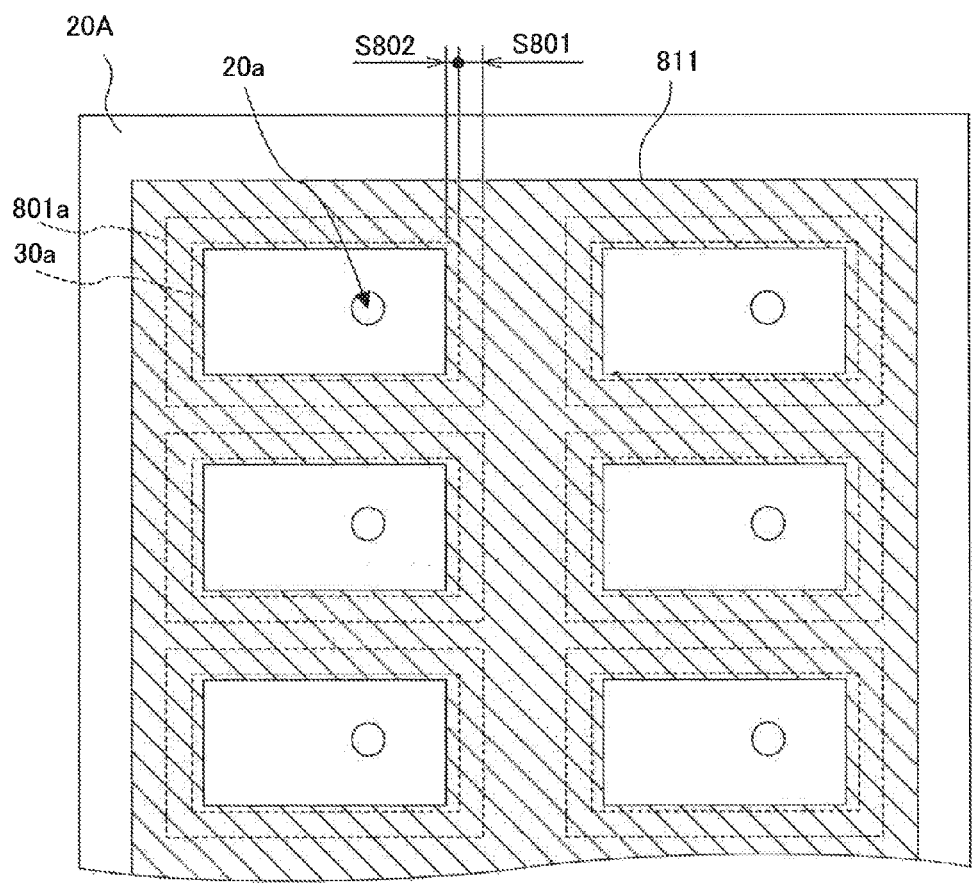
FIG. 16 is a plan view depicting the lower spacer sheet material 20A of the card 801 according to the eighth embodiment.

FIG. 16 is a plan view depicting the lower spacer sheet material 20A of the card 801 according to the eighth embodiment.

The lower spacer sheet material 20A is used for producing the card 801 with multiple layouts. The lower spacer sheet material 20A is a sheet that is laminated as the lower spacer sheet 20.

The thickness adjustment layer 811 is illustrated with the hatched line in the drawing.

The dashed line illustrates the card outline 801a and the substrate outline 30a.

Description is omitted, although an upper spacer sheet material similar to the lower spacer sheet material 20A is used for the upper spacer sheet 40.

Figure 17:
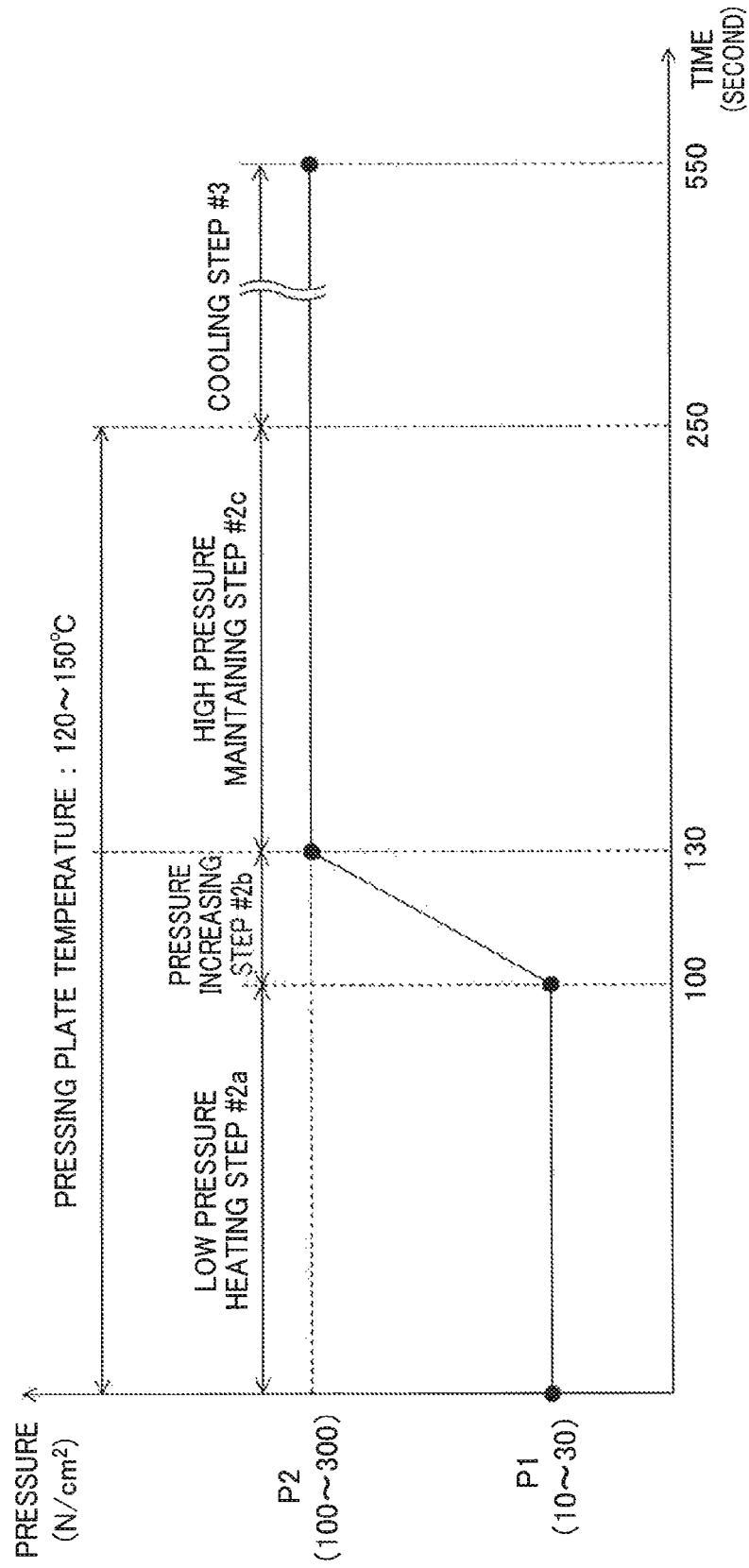
FIG. 17 is a chart illustrating the pressing and heating conditions of the heat pressing of the eighth embodiment.

FIG. 17 is a chart illustrating the pressing and heating conditions of the heat pressing of the eighth embodiment.

In the eighth embodiment, the required time for each step is changed from the first embodiment as described below.

low pressure heating step #2a: 60 seconds (the first embodiment) changed to 100 seconds pressure increasing step #2b: 30 seconds (same as the first embodiment)

high pressure maintaining step #2c: 90 seconds (the first embodiment) changed to 120 seconds cooling step #3: 180 seconds (the first embodiment) changed to 300 seconds total: 9 minutes and 10 seconds (550 seconds)

The pressure and pressing plate temperature were adjusted to within a similar range.

The reason why the required time for the low pressure heating step #2a is set to be longer than the first embodiment is to reliably soften the lower layer 10 and the upper layer 50 by heating so as that the load applied to the IC chip 32 is reduced when the IC chip 32 is embedded between the lower layer 10 and the upper layer 50. In this manner, the manufacturing yield of the card 801 in mass production can be improved.

The required time for the high pressure maintaining step #2c is set to be longer than the first embodiment so as to correspond to the further softened lower layer 10 and upper layer 50. According to a similar reason, the required time for the cooling step #3 is set to be longer than the first embodiment. In this manner, the occurrence of a warp or the like is suppressed for the card 801, thereby improving quality.

Even under the condition described above, the embodiment achieves the production time of 9 minutes and 10 seconds, which is significantly shorter than the 15 minutes of the production time of the card 101 described in the comparative example of the first embodiment. Therefore, the production time of the card 801 can be significantly reduced.

Ninth Embodiment

FIG. 18 depicts the laminate-structure of the card 901 according to a ninth embodiment.

The card 901 is provided in a laminated form so as to have a card thickness of about 0.5 mm, which is larger than the first embodiment. That is, the card thickness of the eighth embodiment is about 0.3 mm, and the card thickness of the ninth embodiment is about 0.5 mm.

The card 901 is formed by laminating, from the lower side Z1, a lower layer 910, a lower spacer sheet 20, a module substrate 30 (substrate), an upper spacer sheet 40, and an upper layer 950.

The lower spacer sheet 20, the module substrate 30 (substrate), and the upper spacer sheet 40 are similar to those of the eighth embodiment. Similarly to the eighth embodiment, thickness adjustment layers 811 and 851 are provided on the lower spacer sheet 20, the module substrate 30, and the upper spacer sheet 40.

The lower layer 910 and the upper layer 950 are laminated as the lowermost layer and the uppermost layer, respectively. A print layer (not shown in the drawing) on which the name of a card company or the like is printed is provided on the lower layer 910 and the upper layer 950.

The material and thickness of each layer are as described Below.

lower layer 910: PET, 190 μm lower spacer sheet 20 and upper spacer sheet 40: PET-G, 40 μm module substrate 30: PET, 45 μm upper layer 950: PET, 190 μm The card 901 is formed to have the configuration as described above to have a card thickness greater than the eighth embodiment.

The thickness of each of the lower spacer sheet 20, the module substrate 30, and the upper spacer sheet 40 is same as the eighth embodiment, so that the component in common with the eighth embodiment can be used.

That is, if the thickness, the arrangement, or the like of the IC chip 32 on the module substrate 30 are the same, the lower spacer sheet 20, the module substrate 30, and the upper spacer sheet 40 can be commonly used for the eighth and the ninth embodiments.

Therefore, firstly in production, a sheet material (see the lower spacer sheet material 20A in FIG. 16) which will be processed into the lower spacer sheet 20 and the upper spacer sheet 40, and the module substrate 30 are prepared. Then other sheets may be additionally prepared according to the thickness of the card ordered.

In this manner, parts management will be easy, and cost reduction can be expected by using common parts.

It is confirmed by a trial production that the formation of the recess C (see FIG. 7D) in the card 901 can be suppressed even when the card thickness is about 0.5 mm.

In this manner, similarly to the eighth embodiment, the card 901 according to the embodiment can improve production efficiency.

Tenth Embodiment

FIG. 19 depicts the laminate-structure of the card 1001 according to a tenth embodiment.

The card 1001 is provided in a laminated form so as to have a card thickness of about 0.8 mm, which is even greater than the ninth embodiment.

As for the card 1001, the thickness of each of the lower layer 1010 and the upper layer 1050 is changed from the ninth embodiment. Other configuration is similar to the ninth embodiment.

That is, the material and thickness of each layer are as described below.

lower layer 1010: PET-G, 350 μm
lower spacer sheet 20 and upper spacer sheet 40: PET-G, 40 μm
module substrate 30: PET, 45 μm
upper layer 1050: PET-G, 350 μm Also in this case, if the specification of the module substrate 30 is common among the eighth to tenth embodiments, the lower spacer sheet 20, the module substrate 30, and the upper spacer sheet 40 can be commonly used, thereby making parts management easy, so that cost reduction can be expected.

Figure 20:
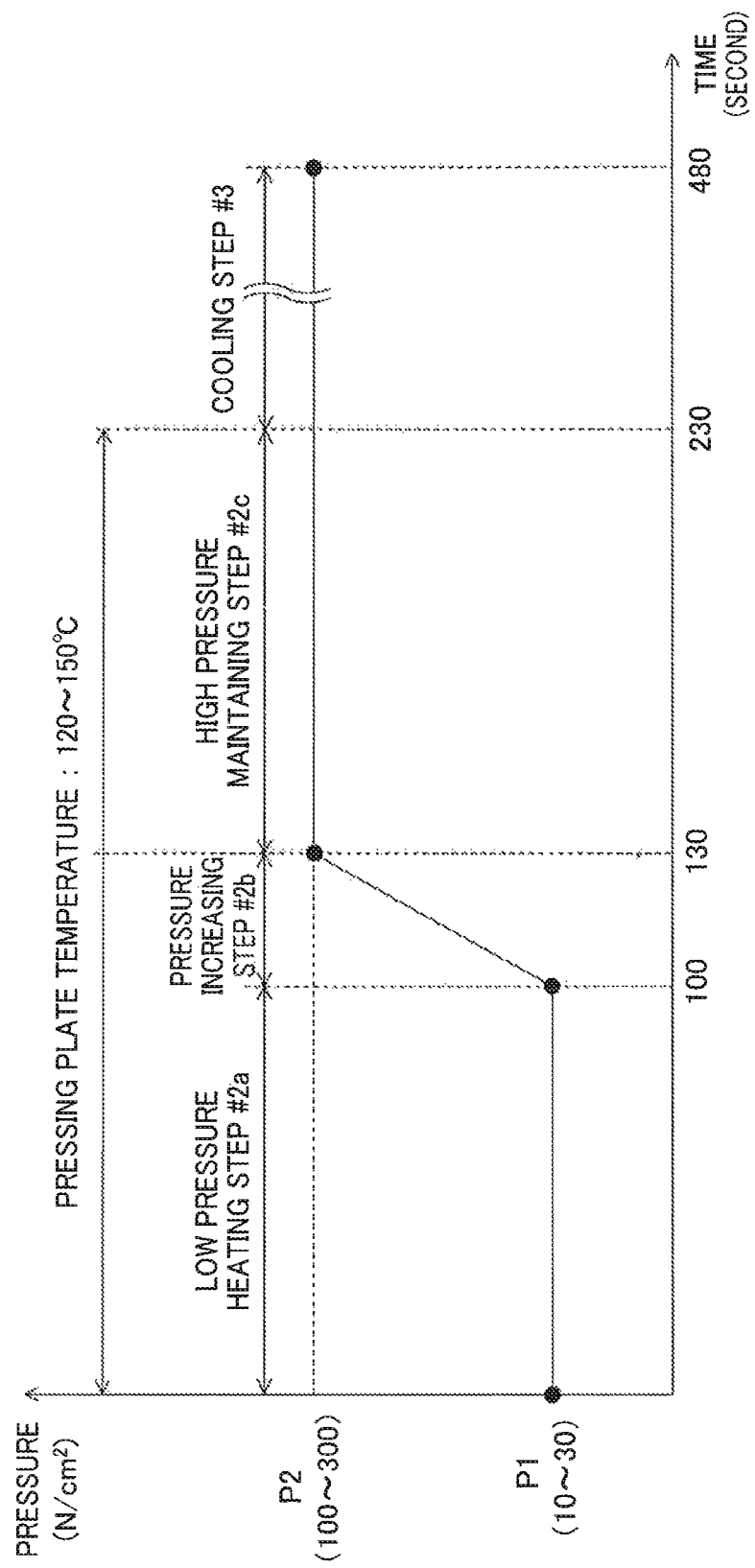
FIG. 20 is a chart illustrating the pressing and heating conditions of the heat pressing of the tenth embodiment.

FIG. 20 is a chart illustrating the pressing and heating conditions of the heat pressing of the tenth embodiment.

The low pressure heating step #2a (100 seconds) and the pressure increasing step #2b (30) are same as the eighth embodiment. The high pressure maintaining step #2c and the cooling step #3 are changed from the eighth embodiment as described below.

high pressure maintaining step #2c: 120 seconds (the eighth embodiment) changed to 100 seconds
cooling step #3: 300 seconds (the eighth embodiment) changed to 250 seconds
total: 8 minutes (480 seconds)

In the embodiment, even when the card forming time (high pressure maintaining step #2c and cooling step #3) is set to be shorter than the eighth embodiment, the embodiment shows a trend that a warp or the like does not occur. This trend can be related to the improvement in rigidity of the card provided by the card thickness larger than the eighth embodiment.

Note that each condition for producing the card may be suitably changed.

Eleventh Embodiment

Figure 21:
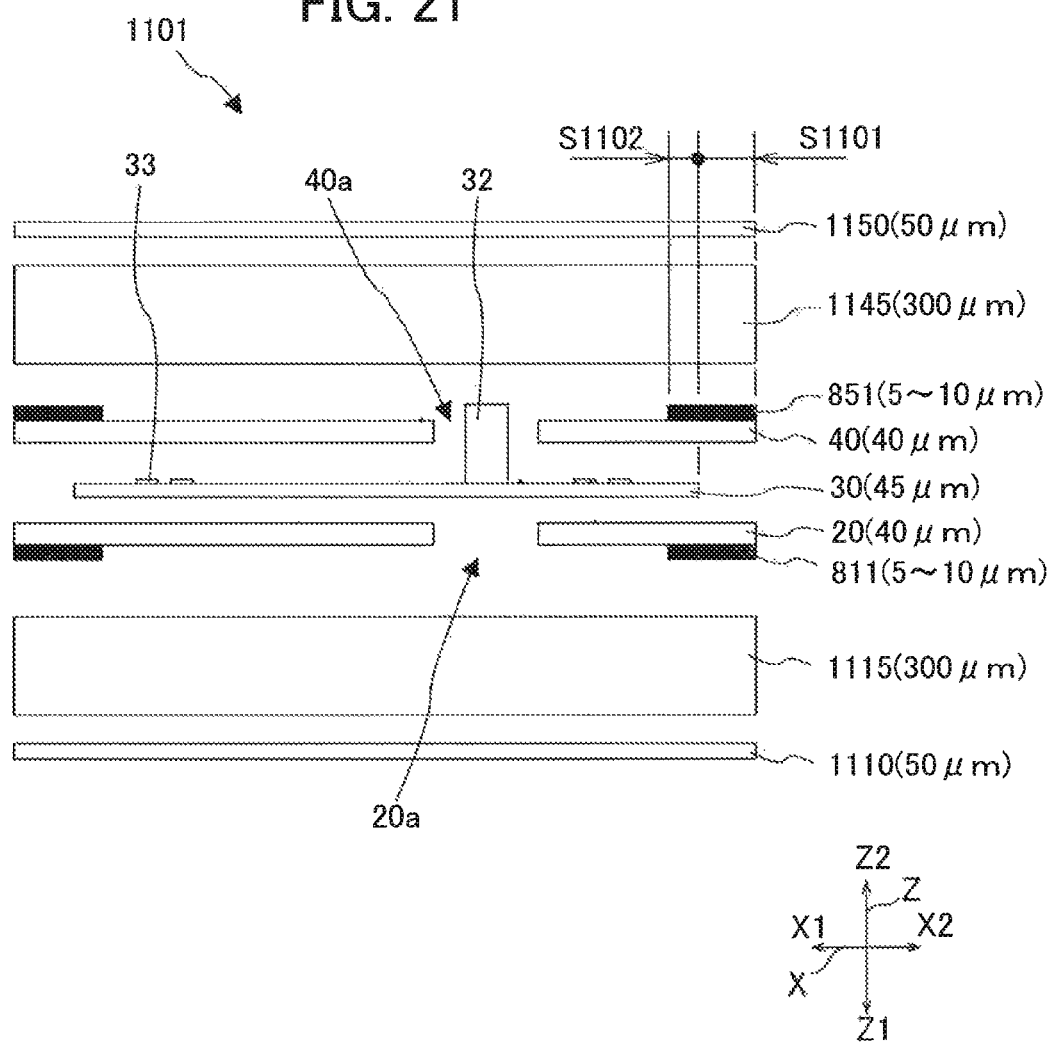
FIG. 21 depicts the laminate-structure of the card 1101 according to an eleventh embodiment.

FIG. 21 depicts the laminate-structure of the card 1101 according to an eleventh embodiment.

The card thickness of the card 1101 is about 0.8 mm similar to the tenth embodiment. However, as for the laminate-structures of the card 1101, layers other than the lower spacer sheet 20, the module substrate 30, and the upper spacer sheet 40 are changed from the tenth embodiment.

In the card 1101, the lower layer 1110, the lower interlayer 1115, the lower spacer sheet 20, the module substrate 30 (substrate), the upper spacer sheet 40, the upper interlayer 1145, and the upper layer 1150 are sequentially laminated from the lower side Z1.

The material and thickness of each layer are as described below.

lower layer 1110: PET-G, 50 μm
lower interlayer 1115: PET-G, 300 μm
lower spacer sheet 20 and upper spacer sheet 40: PET-G, 40 μm
module substrate 30: PET, 45 μm
upper interlayer 1145: PET-G, 300 μm
upper layer 1150: PET-G, 50 μm A print layer (not shown in the drawing) on which the name of a card company or the like is printed is provided on the bottom surface of the lower interlayer 1114.

The lower layer 1110 is a transparent layer. The lower layer 1110 is laminated below the lower interlayer 1114 to protect the print layer on the lower interlayer 1114.

Similarly, the upper interlayer 1116 includes a print layer, and the upper layer 1150 protects the print layer on the upper interlayer 1116.

As in the tenth and the eleventh embodiments, the laminate-structure can be suitably changed for the same card thickness according to the specifications of the printing of the card.

Also in this case, if the specification of the module substrate 30 is common among the eighth to eleventh embodiments, the lower spacer sheet 20, the module substrate 30, and the upper spacer sheet 40 can be commonly used, thereby making parts management easy, so that cost reduction can be expected.

Although the embodiments of the present invention have been described, the present invention is not limited to the embodiments as described above. Various variations and alterations, such as the variation described below, can be made, which fall within the technical scope of the present invention. Furthermore, the effect described in the embodiment is merely an enumeration of the best effect provided by the present invention. So that the effect provided by the present invention is not limited to the effect described in the embodiment. The embodiment described above and the variation described below can be suitably used in combination, though a detailed description is omitted.

Variation (1) In the embodiment, an example in which two or one thickness adjustment layer is provided is described. However, the number of layers is not limited to two or one. For example, three or more thickness adjustment layers may be provided. When three or more thickness adjustment layers are provided, the total thickness of the thickness adjustment layers can be further increased so that the thickness adjustment layers can adapt to, for example, a thick module substrate.

(2) The arrangement of the thickness adjustment layer is not limited to the configuration of the embodiment. The thickness adjustment layer may be provided on at least one layer among the layers. Even in such case, the effect similar to the embodiment can be obtained. In this manner, the layer on which the thickness adjustment layer is provided can be selected according to the requirement of the card production step.

(3) In the embodiment, the example in which holes are provided in the lower spacer sheet 20 and the upper spacer sheet 40 is described. However, it is not limited to the configuration. For example, a notch may be provided instead of a hole.

(4) In the embodiment, the example in which both the lower layer and the upper layer are softened in the low pressure heating step is described. However, it is not limited to the configuration. For example, only one of the lower layer and the upper layer, which applies greater load to the IC chip (contact layer), may be softened.

The invention claimed is:

1. A card formed by bonding layers with each other by pressing comprising:
    a substrate;
    an upper layer that has an outline larger than an outline of the substrate and is disposed above the substrate;
    an upper spacer sheet disposed between the upper layer and the substrate wherein an outline of the spacer sheet has the same size as the upper layer;
    a lower layer that has an outline larger than the outline of the substrate and is disposed below the substrate;
    a lower spacer sheet disposed between the lower layer and the substrate wherein an outline of the spacer sheet has the same size as the lower layer;
    an upper thickness adjustment layer provided in an substrate outer region that is a region between the upper layer and the upper spacer sheet and in an outer side of the outline of the substrate, the thickness adjustment layer being provided by printing on at least one layer among layers forming the card and adjusting thickness in the substrate outer region; and
    a lower thickness adjustment layer provided in an substrate outer region that is a region between the lower layer and the lower spacer sheet and in an outer side of the outline of the substrate, the thickness adjustment layer being provided by printing on at least one layer among layers forming the card and adjusting thickness in the substrate outer region;
    wherein the upper thickness adjustment layer and the lower thickness adjustment layer each has an opening in an area thereof corresponding to the substrate.

2. The card according to claim 1, wherein
    at least a portion of the thickness adjustment layer is provided in a region overlapping the substrate in addition to the substrate outer region, when viewed from a direction normal to a card surface.

3. The card according to claim 2, wherein
    the thickness adjustment layer has a thickness providing close contact between a pressing plate and the upper layer as well as close contact between the pressing plate and the lower layer during pressing.

4. The card according to claim 2, wherein
    an electronic component is mounted on the substrate, and
    a spacer sheet is disposed between the upper layer and the lower layer, the spacer sheet having a penetration hole or a cutout allowing the electronic component to escape therein, an outline of the spacer sheet having the same size as the upper layer and the lower layer.

5. The card according to claim 2, wherein
    the thickness adjustment layer is provided on the entire circumference of the layer provided with the thickness adjustment layer.

6. The card according to claim 1, wherein
    the thickness adjustment layer has a thickness providing close contact between a pressing plate and the upper layer as well as close contact between the pressing plate and the lower layer during pressing.

7. The card according to claim 6, wherein
    an electronic component is mounted on the substrate, and
    a spacer sheet is disposed between the upper layer and the lower layer, the spacer sheet having a penetration hole or a cutout allowing the electronic component to escape therein, an outline of the spacer sheet having the same size as the upper layer and the lower layer.

8. The card according to claim 6, wherein
    the thickness adjustment layer is provided on the entire circumference of the layer provided with the thickness adjustment layer.

9. The card according to claim 1, wherein
    an electronic component is mounted on the substrate, and
    the upper spacer sheet and the lower spacer sheet has a penetration hole or a cutout allowing the electronic component to escape therein.

10. The card according to claim 9, wherein
    the thickness adjustment layer is provided on the entire circumference of the layer provided with the thickness adjustment layer.

11. The card according to claim 1, wherein
    the upper thickness adjustment layer is provided on the upper spacer sheet and the lower thickness adjustment layer is provided on the lower spacer sheet.

12. The card according to claim 11, wherein
    the thickness adjustment layer is provided on the entire circumference of the layer provided with the thickness adjustment layer.

13. The card according to claim 1, wherein
    the thickness adjustment layer is provided on the entire circumference of the layer provided with the thickness adjustment layer.

14. A card production method for the card according to claim 1 comprising:
    a laminating step for laminating the substrate and each layer; and
    a pressing step for sandwiching the upper layer and the lower layer laminated in the laminating step between pressing plates, in an up-and-down direction so as to perform pressing by keeping close contact between the pressing plate and the upper layer as well as close contact between the pressing plate and the lower layer.

15. The card production method according to claim 14, wherein
    an electronic component is mounted on the substrate, and
    the pressing step includes
    a heating step for heating at least one of a contact layer making contact with the electronic component and a contact layer making contact with a portion of the substrate which is a region embedded with the electronic component until the contact layer is softened, and
    an electronic component embedding step for embedding the electronic component in the contact layer by gradually increasing pressure applied on the contact layer that is softened in the heating step.

16. The card production method according to claim 14, wherein
    the card is produced in multiple layouts.

* * * * *